(12) United States Patent
Lee

(10) Patent No.: US 12,142,330 B2
(45) Date of Patent: Nov. 12, 2024

(54) SEMICONDUCTOR MEMORY DEVICE AND METHOD OF OPERATING THE SEMICONDUCTOR MEMORY DEVICE

(71) Applicant: SK hynix Inc., Icheon-si (KR)

(72) Inventor: Hee Youl Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 178 days.

(21) Appl. No.: 17/518,316

(22) Filed: Nov. 3, 2021

(65) Prior Publication Data

US 2022/0383968 A1 Dec. 1, 2022

(30) Foreign Application Priority Data

May 26, 2021 (KR) .......................... 10-2021-0067942

(51) Int. Cl.
*G11C 16/34* (2006.01)
*G11C 11/56* (2006.01)
*G11C 16/10* (2006.01)

(52) U.S. Cl.
CPC ...... *G11C 16/3459* (2013.01); *G11C 11/5628* (2013.01); *G11C 11/5671* (2013.01); *G11C 16/10* (2013.01)

(58) Field of Classification Search
CPC . G11C 16/3459; G11C 16/34; G11C 16/3436; G11C 16/3404; G11C 11/5628; G11C 11/5671; G11C 16/10; G11C 16/0483; G11C 16/08; G11C 16/24
See application file for complete search history.

(56) References Cited

U.S. PATENT DOCUMENTS

| | | | | |
|---|---|---|---|---|
| 2008/0239806 | A1* | 10/2008 | Moschiano | G11C 11/5628 365/185.23 |
| 2014/0185387 | A1* | 7/2014 | Aritome | G11C 16/06 365/185.22 |
| 2015/0221374 | A1* | 8/2015 | Lee | G11C 16/0483 365/185.11 |
| 2016/0293259 | A1* | 10/2016 | Kim | G11C 11/5628 |

FOREIGN PATENT DOCUMENTS

KR 101063571 B1 9/2011
KR 1020190073943 A 6/2019

* cited by examiner

*Primary Examiner* — Uyen Smet
(74) *Attorney, Agent, or Firm* — WILLIAM PARK & ASSOCIATES LTD.

(57) ABSTRACT

A method of operating a semiconductor memory device includes a plurality of program loops for programming selected memory cells among a plurality of memory cells. Each of the plurality of program loops includes setting a state of a bit line connected to the selected memory cells, applying a program voltage to a word line connected to the selected memory cells, and performing a verify operation on the selected memory cells using a first pre-verify voltage, a second pre-verify voltage greater than the first pre-verify voltage, and a main verify voltage greater than the second pre-verify voltage. A first program permission cell, a second program permission cell, a third program permission cell, and a program prohibition cell are determined by performing the verify operation.

16 Claims, 20 Drawing Sheets

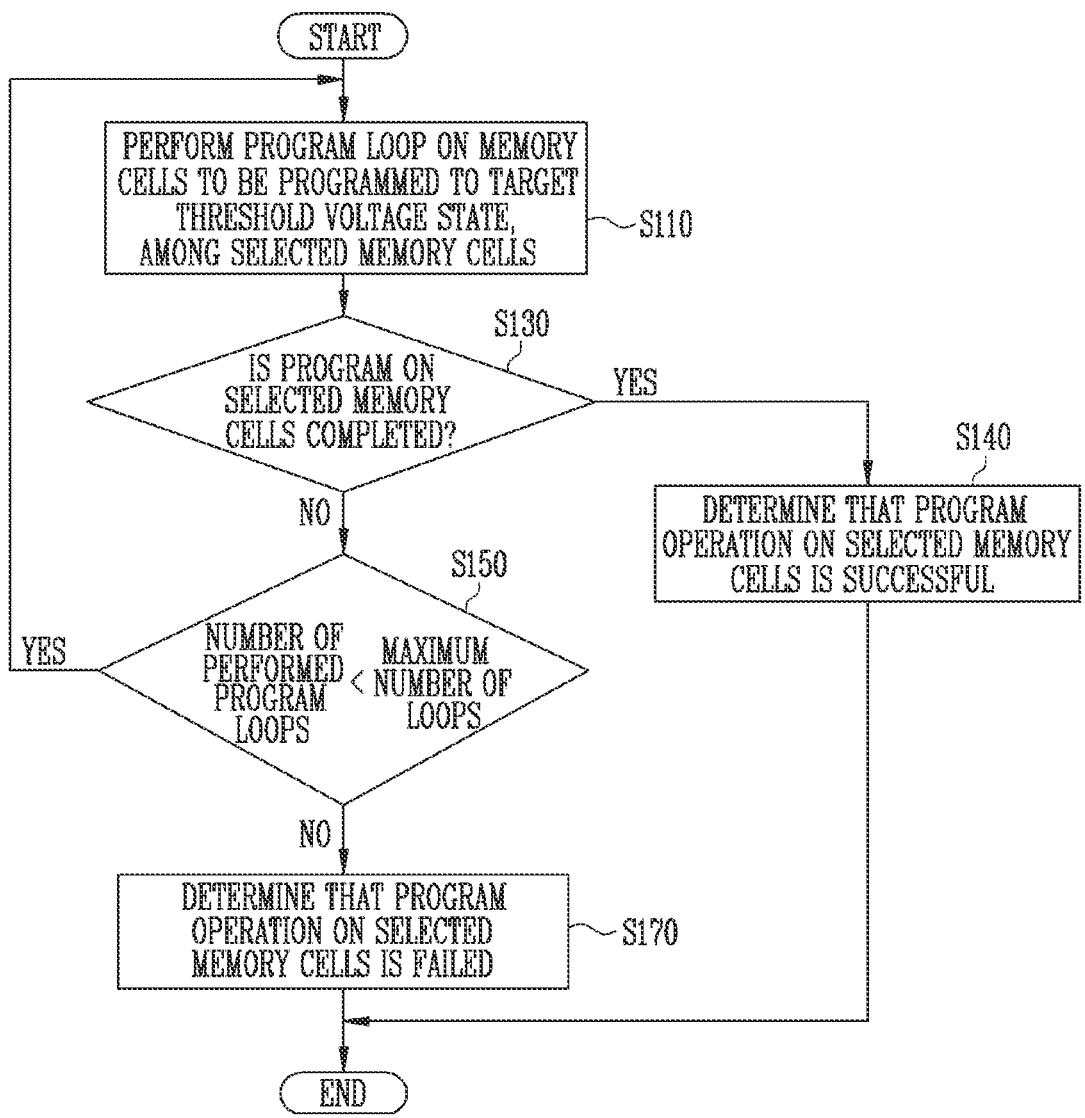

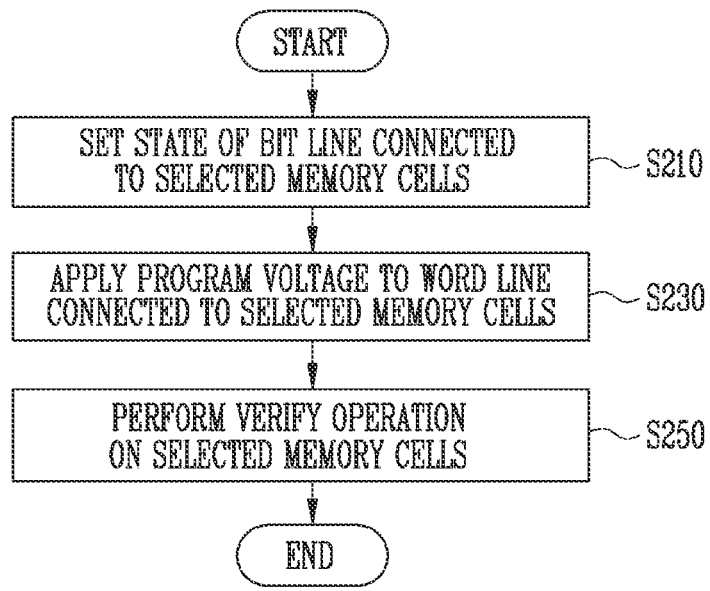
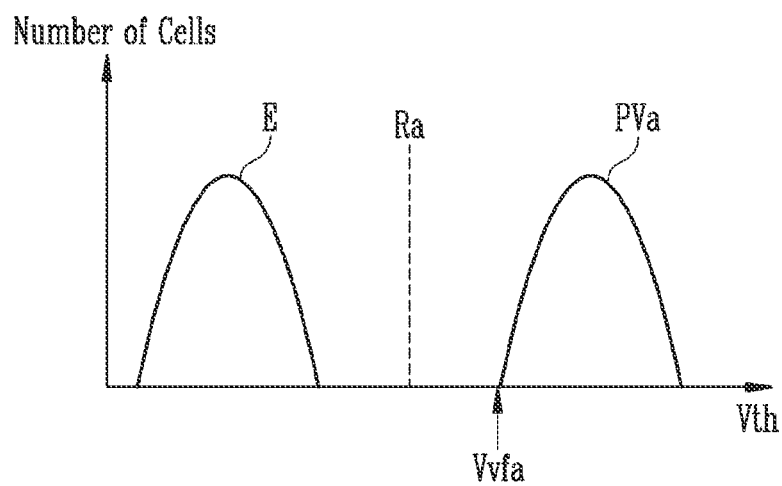

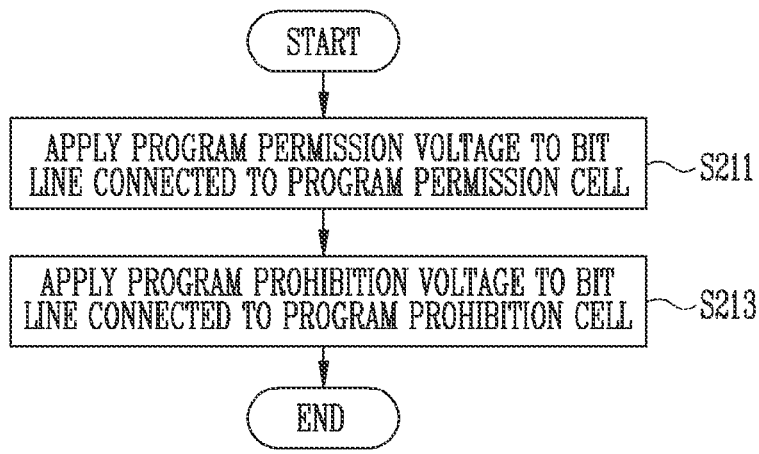
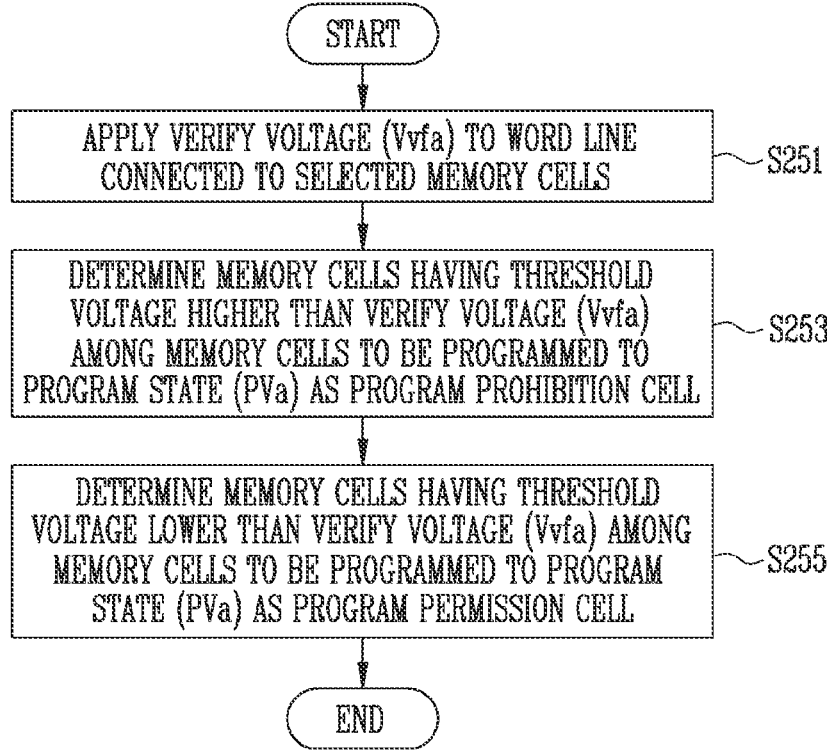

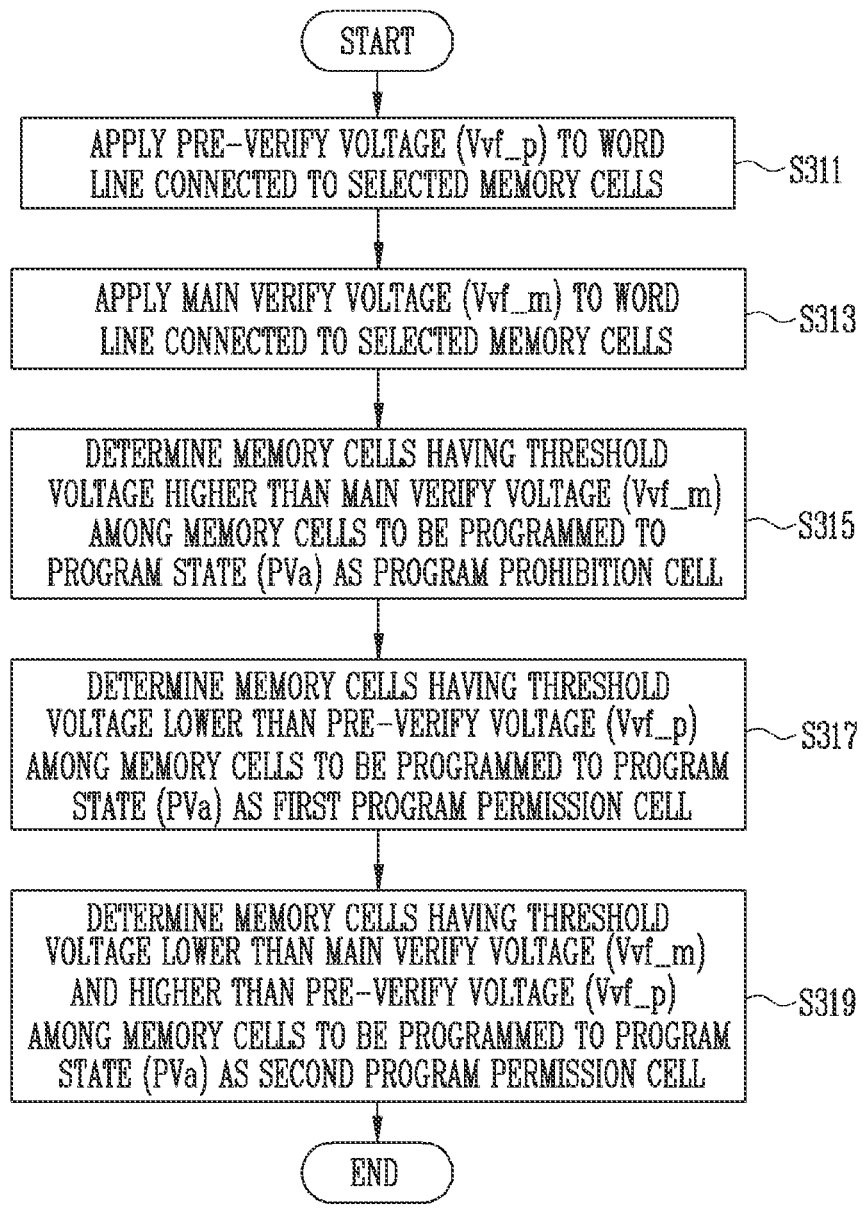

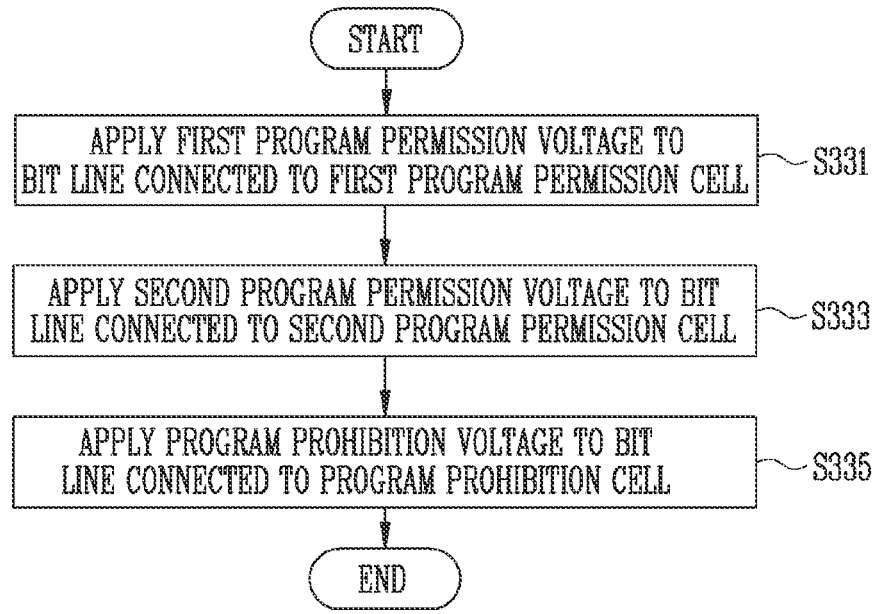
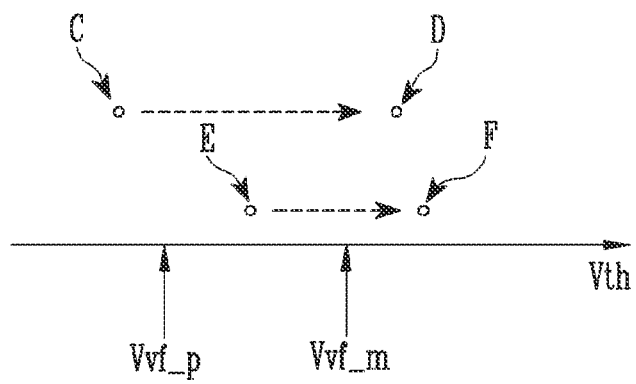

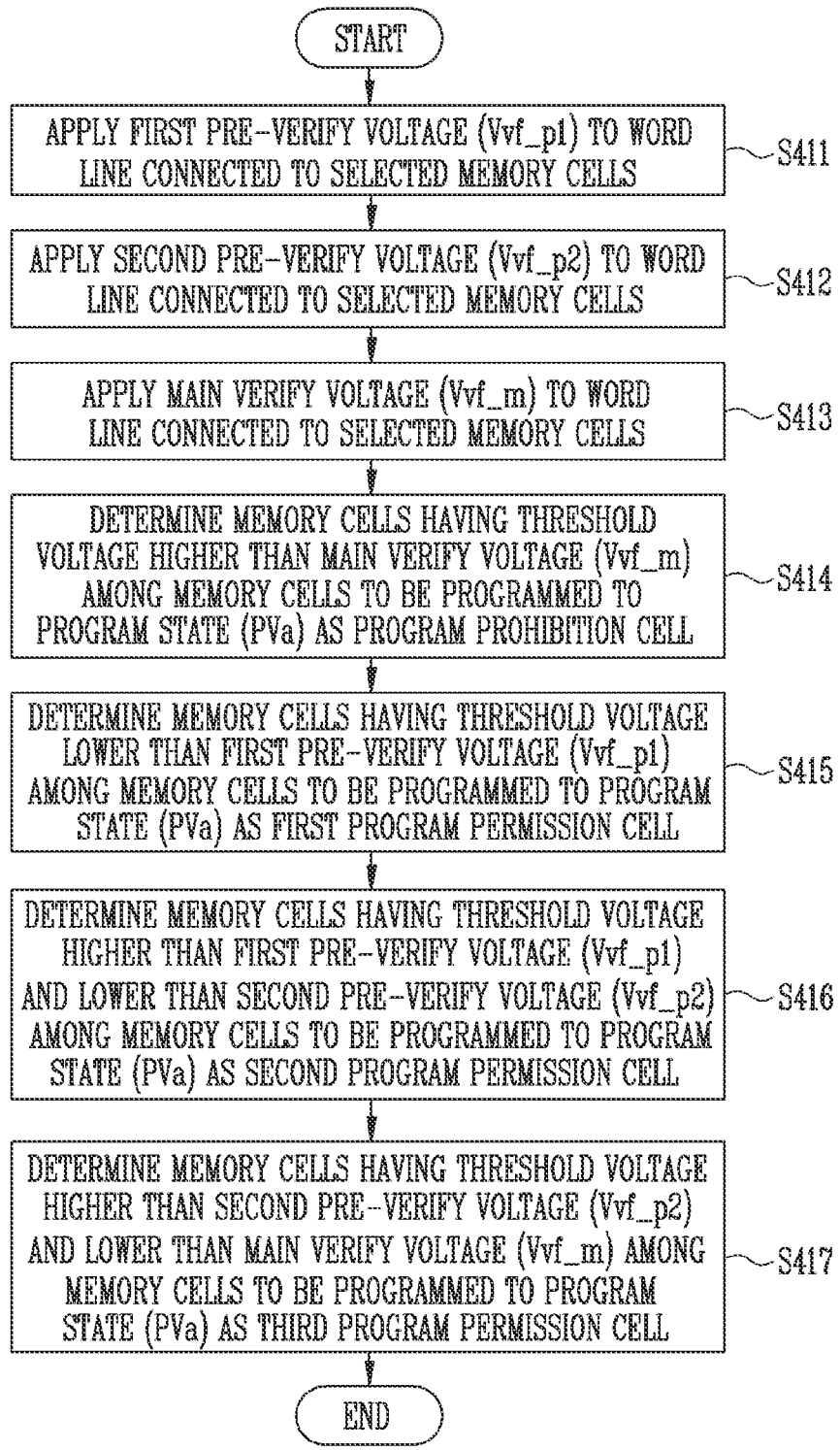

SEMICONDUCTOR MEMORY DEVICE AND METHOD OF OPERATING THE SEMICONDUCTOR MEMORY DEVICE

CROSS-REFERENCE TO RELATED APPLICATION

The present application claims priority under 35 U.S.C. § 119(a) to Korean patent application number 10-2021-0067942 filed on May 26, 2021, in the Korean Intellectual Property Office, the entire disclosure of which is incorporated by reference herein.

BACKGROUND

1. Technical Field

The present disclosure relates to an electronic device, and more particularly, to a semiconductor memory device and a method of operating the semiconductor memory device.

2. Related Art

A semiconductor memory device may be formed in a two-dimensional structure in which strings are horizontally arranged on a semiconductor substrate, or may be formed in a three-dimensional structure in which the strings are vertically stacked on the semiconductor substrate. A three-dimensional semiconductor memory device is a semiconductor memory device designed to resolve a limit of an integration degree of a two-dimensional memory device, and may include a plurality of memory cells that are vertically stacked on a semiconductor substrate. Meanwhile, a controller may control an operation of the semiconductor memory device.

SUMMARY

According to an embodiment of the present disclosure, a method of operating a semiconductor memory device may include a plurality of program loops for programming selected memory cells among a plurality of memory cells. Each of the plurality of program loops may include setting a state of a bit line connected to the selected memory cells, applying a program voltage to a word line connected to the selected memory cells, and performing a verify operation on the selected memory cells using a first pre-verify voltage, a second pre-verify voltage greater than the first pre-verify voltage, and a main verify voltage greater than the second pre-verify voltage. A first program permission cell, a second program permission cell, a third program permission cell, and a program prohibition cell may be determined by performing the verify operation.

According to another embodiment of the present disclosure, a method of operating a semiconductor memory device may include a plurality of program loops for programming selected memory cells among a plurality of memory cells, each of which stores N bits. Each of the plurality of program loops may include setting a state of a bit line connected to the selected memory cells, applying a program voltage to a word line connected to the selected memory cells, and performing a verify operation corresponding to an i-th program state using a first pre-verify voltage, a second pre-verify voltage, and a main verify voltage corresponding to the i-th program state among first to $(2^N-1)$-th program states. Here, N may be a natural number greater than 1, and i may be a natural number greater than 0 and less than $2^N$.

According to another embodiment of the present disclosure, a method of operating a semiconductor memory device may include a plurality of program loops for programming selected memory cells among a plurality of memory cells. Each of the plurality of program loops may include: setting states of bit lines connected to the selected memory cells; applying program voltages to word lines connected to the selected memory cells; performing a verify operation on the selected memory cells to distinguish program permission cells from program prohibition cells; and controlling threshold voltage movement widths of respective program permission cells from the selected memory cells by applying different program permission voltages to respective bit lines connected to the program permission cells.

BRIEF DESCRIPTION OF THE DRAWINGS

FIG. 8 is a flowchart illustrating a method of operating a semiconductor memory device according to an embodiment of the present disclosure.

FIG. 9 is a flowchart illustrating an embodiment of step S110 of FIG. 8.

FIG. 10 is a graph illustrating a threshold voltage distribution after a program operation of a single-level cell (SLC).

FIG. 11 is a flowchart Illustrating an embodiment of step S210 of FIG. 9.

FIG. 12 is a flowchart illustrating an embodiment of step S250 of FIG. 9.

FIG. 15 is a flowchart illustrating another embodiment of step S250 of FIG. 9.

FIG. 16 is a flowchart illustrating another embodiment of step S210 of FIG. 9.

FIG. 17 is a diagram illustrating a threshold voltage of a first program permission cell, a second program permission cell, and a program prohibition cell.

FIG. 18 is a flowchart illustrating still another embodiment of step S250 of FIG. 9.

DETAILED DESCRIPTION

Figure 1:
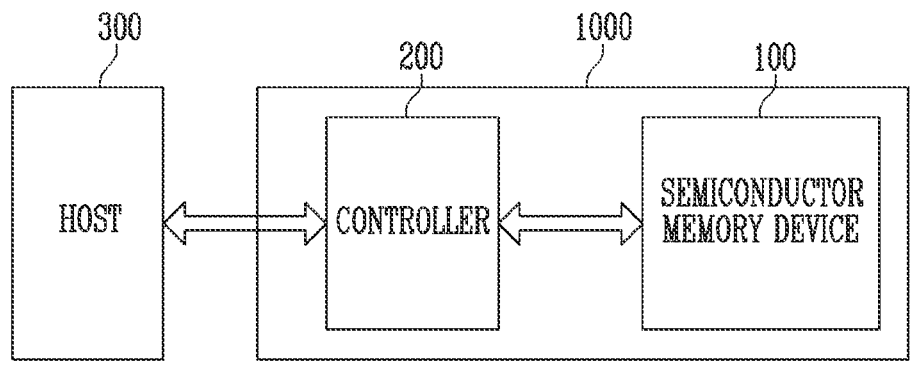
FIG. 1 is a block diagram illustrating a memory system including a semiconductor memory device and a controller according to an embodiment of the present disclosure.

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and should not be construed as being limited to the embodiments described in the present specification or application.

An embodiment of the present disclosure provides a semiconductor memory device and a method of operating the semiconductor memory device capable of narrowing a threshold voltage distribution width of memory cells during a program operation.

In an embodiment, performing the verify operation on the selected memory cells may include applying the first pre-verify voltage to the word line connected to the selected memory cells, applying the second pre-verify voltage to the word line connected to the selected memory cells, and applying the main verify voltage to the word line connected to the selected memory cells.

In an embodiment, performing the verify operation on the selected memory cells may further include determining memory cells having a threshold voltage higher than the main verify voltage as the program prohibition cell.

In an embodiment, performing the verify operation on the selected memory cells may further include determining memory cells having a threshold voltage lower than the first pre-verify voltage as the first program permission cell, determining memory cells having a threshold voltage higher than the first pre-verify voltage and lower than the second pre-verify voltage as the second program permission cell, and determining memory cells having a threshold voltage higher than the second pre-verify voltage and lower than the main verify voltage as the third program permission cell.

In an embodiment, setting the state of the bit line connected to the selected memory cells may include applying a first program permission voltage to a bit line connected to the first program permission cell, applying a second program permission voltage greater than the first program permission voltage to a bit line connected to the second program permission cell, and applying a third program permission voltage greater than the second program permission voltage to a bit line connected to the third program permission cell.

In an embodiment, setting the state of the bit line connected to the selected memory cells may further include applying a program prohibition voltage greater than the third program permission voltage to a bit line connected to the program prohibition cell.

In an embodiment, performing the verify operation corresponding to the i-th program state may include applying a first pre-verify voltage corresponding to the first program state to the word line connected to the selected memory cells, applying a second pre-verify voltage corresponding to the first program state to the word line connected to the selected memory cells, and applying a main verify voltage corresponding to the first program state to the word line connected to the selected memory cells.

In an embodiment, the second pre-verify voltage corresponding to the first program state may be greater than the first pre-verify voltage corresponding to the first program state, and the main verify voltage corresponding to the first program state may be greater than the second pre-verify voltage corresponding to the first program state.

In an embodiment, performing the verify operation corresponding to the i-th program state may further include determining memory cells having a threshold voltage higher than the main verify voltage among the memory cells to be programmed to the first program state as a program prohibition cell.

In an embodiment, performing the verify operation corresponding to the i-th program state may further include determining memory cells having a threshold voltage lower than the first pre-verify voltage corresponding to the first program state among the memory cells to be programmed to the first program state as a first program permission cell, determining a memory cell having a threshold voltage higher than the first pre-verify voltage corresponding to the first program state and lower than the second pre-verify voltage corresponding to the first program state among the memory cells to be programmed to the first program state as a second program permission cell, and determining a memory cell having a threshold voltage higher than the second pre-verify voltage corresponding to the first program state and lower than the main verify voltage corresponding to the first program state among the memory cells to be programmed to the first program state as a third program permission cell.

In an embodiment, performing the verify operation corresponding to the i-th program state may further include determining memory cells to be programmed to the second to $(2^N-1)$-th program states as the first program permission cell.

In an embodiment, setting the state of the bit line connected to the selected memory cells may include applying a first program permission voltage to a bit line connected to the first program permission cell, applying a second program permission voltage greater than the first program permission voltage to a bit line connected to the second program permission cell, and applying a third program permission voltage greater than the second program permission voltage to a bit line connected to the third program permission cell.

In an embodiment, setting the state of the bit line connected to the selected memory cells may further include applying a program prohibition voltage greater than the third program permission voltage to a bit line connected to the program prohibition cell.

The present technology may provide a semiconductor memory device and a method of operating the same capable of narrowing a threshold voltage distribution width of memory cells during a program operation.

FIG. 1 is a block diagram illustrating a memory system including a semiconductor memory device and a controller according to an embodiment of the present disclosure.

Referring to FIG. 1, the memory system 1000 includes the semiconductor memory device 100 and the controller 200. In addition, the memory system 1000 communicates with a host 300. The controller 200 controls an overall operation of the semiconductor memory device 100. In addition, the controller 200 controls the operation of the semiconductor memory device 100 based on a command received from the host 300.

Figure 2:
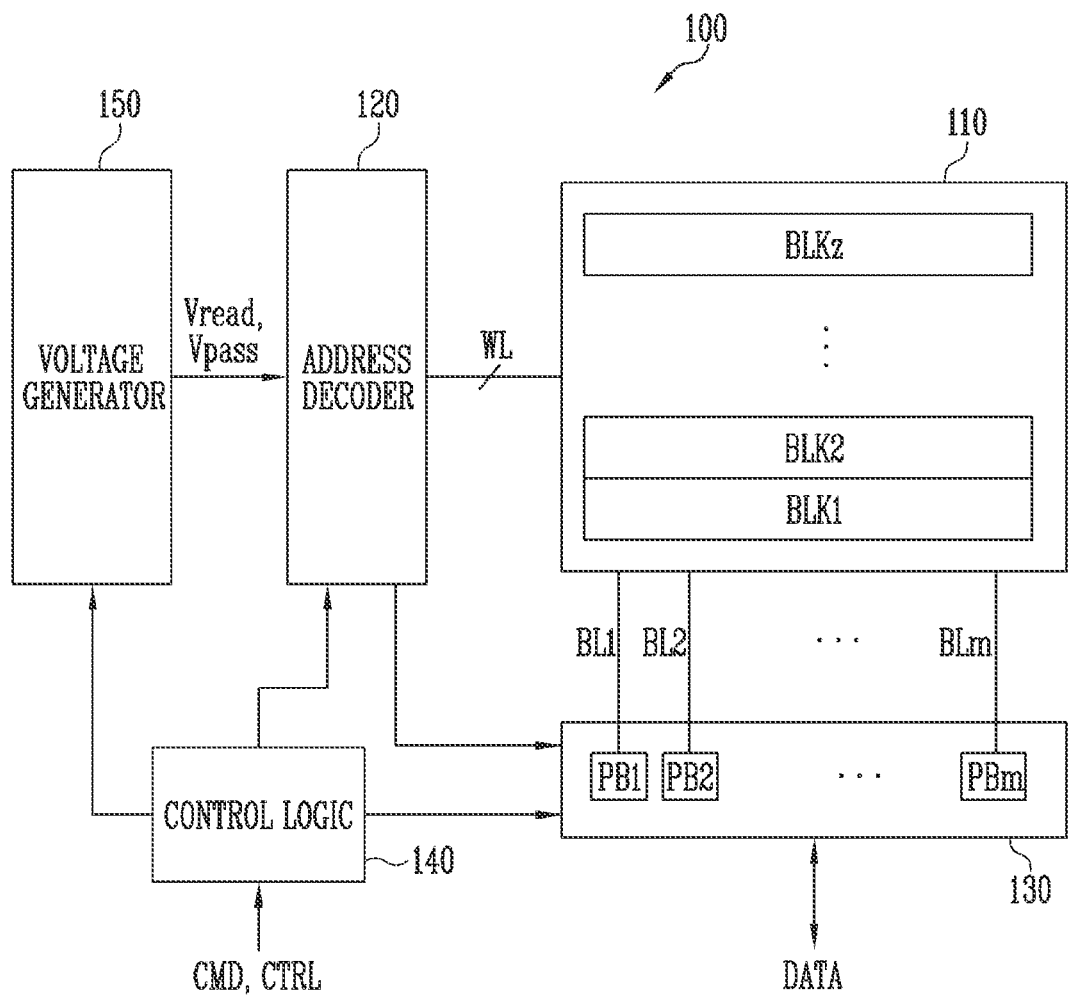
FIG. 2 is a block diagram illustrating the semiconductor memory device of FIG. 1.

FIG. 2 is a block diagram illustrating the semiconductor memory device of FIG. 1.

Referring to FIG. 2, the semiconductor memory device 100 includes a memory cell array 110, an address decoder 120, a read and write circuit 130, a control logic 140, and a voltage generator 150.

The memory cell array 110 includes a plurality of memory blocks BLK1 to BLKz. The plurality of memory blocks BLK1 to BLKz are connected to the address decoder 120 through word lines WL. The plurality of memory blocks BLK1 to BLKz are connected to the read and write circuit 130 through bit lines BL1 to BLm. Each of the plurality of memory blocks BLK1 to BLKz includes a plurality of memory cells. As an embodiment, the plurality of memory cells are non-volatile memory cells, and may be configured of non-volatile memory cells having a vertical channel structure. The memory cell array 110 may be configured as a memory cell array of a two-dimensional structure. According to an embodiment, the memory cell array 110 may be configured as a memory cell array of a three-dimensional structure. Meanwhile, each of the plurality of memory cells included in the memory cell array may store at least one bit of data. In an embodiment, each of the plurality of memory cells included in the memory cell array 110 may be a single-level cell (SLC) storing one bit of data. In another embodiment, each of the plurality of memory cells included in the memory cell array 110 may be a multi-level cell (MLC) storing two bits of data. In still another embodiment, each of the plurality of memory cells included in the memory cell array 110 may be a triple-level cell storing three bits of data. In still another embodiment, each of the plurality of memory cells included in the memory cell array 110 may be a quad-level cell storing four bits of data. According to an embodiment, the memory cell array 110 may include a plurality of memory cells each storing five or more bits of data.

The address decoder 120, the read and write circuit 130, and the voltage generator 150 operate as a peripheral circuit that drives the memory cell array 110. The address decoder 120 is connected to the memory cell array 110 through the word lines WL. The address decoder 120 is configured to operate in response to control of the control logic 140. The address decoder 120 receives an address through an input/output buffer (not shown) inside the semiconductor memory device 100.

The address decoder 120 is configured to decode a block address among received addresses. The address decoder 120 selects at least one memory block according to the decoded block address. In addition, the address decoder 120 applies a read voltage Vread generated by the voltage generator 150 to a selected word line among the selected memory block at a read voltage application operation during a read operation, and applies a pass voltage Vpass to the remaining unselected word lines. In addition, the address decoder 120 applies a verify voltage generated by the voltage generator 150 to the selected word line among the selected memory block and applies the pass voltage Vpass to the remaining unselected word lines during a program verify operation.

The address decoder 120 is configured to decode a column address of the received addresses. The address decoder 120 transmits the decoded column address to the read and write circuit 130.

The read operation and a program operation of the semiconductor memory device 100 are performed in a page unit. Addresses received at a time of a request of the read operation and the program operation include a block address, a row address, and a column address. The address decoder 120 selects one memory block and one word line according to the block address and the row address. The column address is decoded by the address decoder 120 and is provided to the read and write circuit 130.

The address decoder 120 may include a block decoder, a row decoder, a column decoder, an address buffer, and the like.

The read and write circuit 130 includes a plurality of page buffers PB1 to PBm. The read and write circuit 130 may operate as a "read circuit" during a read operation of the memory cell array 110 and may operate as a "write circuit" during a write operation of the memory cell array 110. The plurality of page buffers PB1 to PBm are connected to the memory cell array 110 through the bit lines BL1 to BLm. During the read operation and the program verify operation, in order to sense a threshold voltage of the memory cells, the plurality of page buffers PB1 to PBm sense a change of an amount of a current flowing according to a program state of a corresponding memory cell through a sensing node while continuously supplying a sensing current to the bit lines connected to the memory cells, and latches the sensed change as sensing data. The read and write circuit 130 operates in response to page buffer control signals output from the control logic 140.

During the read operation, the read and write circuit 130 senses data of the memory cell, temporarily stores read data, and outputs data DATA to the input/output buffer (not shown) of the semiconductor memory device 100. As an example of an embodiment, the read and write circuit 130 may include a column selection circuit, and the like, in addition to the page buffers (or page registers).

The control logic 140 is connected to the address decoder 120, the read and write circuit 130, and the voltage generator 150. The control logic 140 receives a command CMD and a control signal CTRL through the input/output buffer (not shown) of the semiconductor memory device 100. The control logic 140 is configured to control overall operations of the semiconductor memory device 100 in response to the control signal CTRL. In addition, the control logic 140 outputs a control signal for adjusting a sensing node precharge potential level of the plurality of page buffers PB1 to PBm. The control logic 140 may control the read and write circuit 130 to perform the read operation of the memory cell array 110.

The voltage generator 150 generates the read voltage Vread and the pass voltage Vpass during the read operation in response to the control signal output from the control logic 140. In order to generate a plurality of voltages having various voltage levels, the voltage generator 150 may include a plurality of pumping capacitors that receive an internal power voltage, and generate the plurality of voltages by selectively activating the plurality of pumping capacitors in response to the control of the control logic 140. As described above, the voltage generator 150 may include the charge pump, and the charge pump may include the plurality of pumping capacitors described above. A specific configuration of the charge pump included in the voltage generator 150 may be variously designed as necessary.

The address decoder 120, the read and write circuit 130, and the voltage generator 150 may function as a "peripheral circuit" that performs the read operation, the write operation, and an erase operation on the memory cell array 110. The peripheral circuit performs the read operation, the write operation, and the erase operation on the memory cell array 110 based on the control of the control logic 140.

Figure 3:
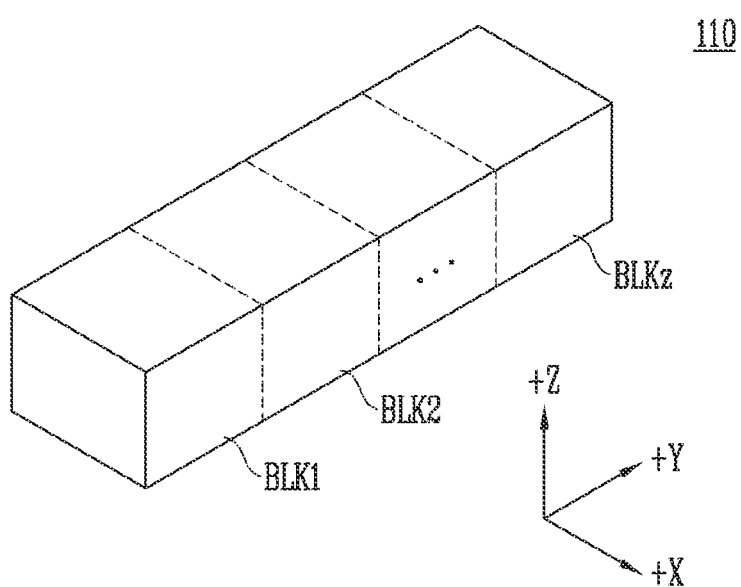
FIG. 3 is a diagram illustrating an embodiment of a memory cell array of FIG. 2.

FIG. 3 is a diagram illustrating an embodiment of the memory cell array of FIG. 2.

Referring to FIG. 3, the memory cell array 110 includes a plurality of memory blocks BLK1 to BLKz. Each memory block may have a three-dimensional structure. Each memory block includes a plurality of memory cells stacked on a substrate. Such plurality of memory cells are arranged along a +X direction, a +Y direction, and a +Z direction. A structure of each memory block is described below with reference to FIGS. 4 and 5.

Figure 4:
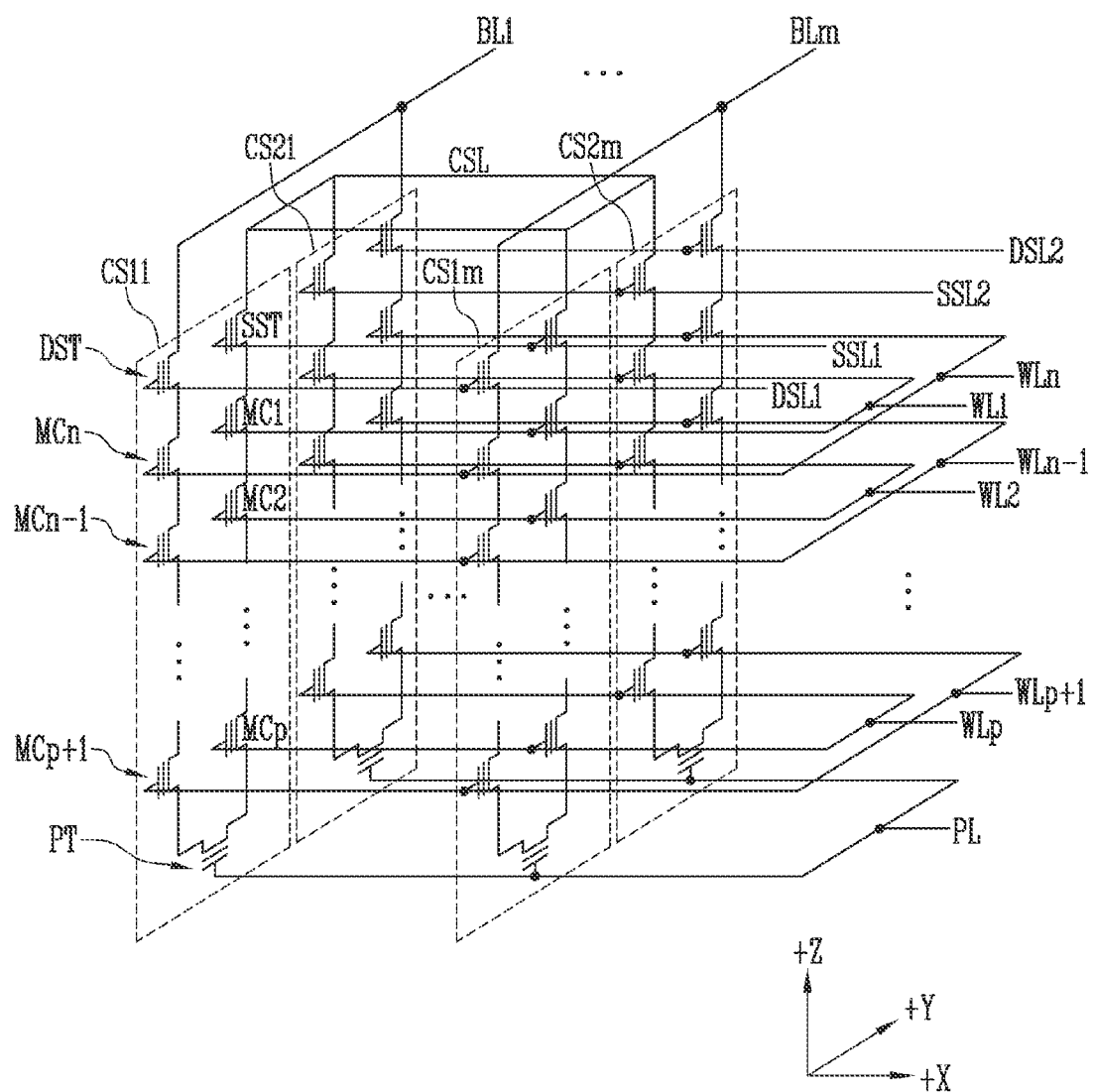
FIG. 4 is a circuit diagram illustrating any one memory block BLKa among memory blocks BLK1 to BLKz of FIG. 3.

FIG. 4 is a circuit diagram illustrating any one memory block BLKa among the memory blocks BLK1 to BLKz of FIG. 3.

Referring to FIG. 4, the memory block BLKa includes a plurality of cell strings CS11 to CS1m and CS21 to CS2m. As an embodiment, each of the plurality of cell strings CS11 to CS1m and CS21 to CS2m may be formed in a 'U' shape. In the memory block BLKa, m cell strings are arranged in a row direction (that is, the +X direction). In FIG. 4, two cell strings are arranged in a column direction (that is, the +Y direction). However, this is for convenience of description and it may be understood that three or more cell strings may be arranged in the column direction.

Each of the plurality of cell strings CS11 to CS1m and CS21 to CS2m includes at least one source select transistor SST, first to n-th memory cells MC1 to MCn, a pipe transistor PT, and at least one drain select transistor DST.

Each of the select transistors SST and DST and the memory cells MC1 to MCn may have a similar structure. As an embodiment, each of the select transistors SST and DST and the memory cells MC1 to MCn may include a channel layer, a tunneling insulating film, a charge storage film, and a blocking insulating film. As an embodiment, a pillar for providing the channel layer may be provided in each cell string. As an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCp.

As an embodiment, the source select transistors of the cell strings arranged in the same row are connected to a source select line extending in the row direction, and the source select transistors of the cell strings arranged in different rows are connected to different source select lines. In FIG. 4, the source select transistors of the cell strings CS11 to CS1m of a first row are connected to a first source select line SSL1. The source select transistors of the cell strings CS21 to CS2m of a second row are connected to a second source select line SSL2.

As another embodiment, the source select transistors of the cell strings CS11 to CS1m and CS21 to CS2m may be commonly connected to one source select line.

The first to n-th memory cells MC1 to MCn of each cell string are connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a direction opposite to the +Z direction, and are connected in series between the source select transistor SST and the pipe transistor PT. The (p+1)-th to n-th memory cells MCp+1 to MCn are sequentially arranged in the +Z direction, and are connected in series between the pipe transistor PT and the drain select transistor DST. The first to p-th memory cells MC1 to MCp and the (p+1)-th to n-th memory cells MCp+1 to MCn are connected to each other through the pipe transistor PT. Gates of the first to n-th memory cells MC1 to MCn of each cell string are connected to the first to n-th word lines WL1 to WLn, respectively.

A gate of the pipe transistor PT of each cell string is connected to a pipeline PL.

The drain select transistor DST of each cell string is connected between a corresponding bit line and the memory cells MCp+1 to MCn. The drain select transistor of the cell strings arranged in the row direction is connected to the drain select line extending in the row direction. The drain select transistors of the cell strings CS11 to CS1m of the first row are connected to a first drain select line DSL1. The drain select transistors of the cell strings CS21 to CS2m of the second row are connected to a second drain select line DSL2.

The cell strings arranged in the column direction are connected to the bit lines extending in the column direction. In FIG. 4, the cell strings CS11 and CS21 of the first column are connected to the first bit line BL1. The cell strings CS1m and CS2m of the m-th column are connected to the m-th bit line BLm.

The memory cells connected to the same word line in the cell strings arranged in the row direction configure one page. For example, the memory cells connected to the first word line WL1, among the cell strings CS11 to CS1m of the first row configure one page. The memory cells connected to the first word line WL1, among the cell strings CS21 to CS2m of the second row configure another page. The cell strings arranged in one row direction may be selected by selecting any one of the drain select lines DSL1 and DSL2. One page of the selected cell strings may be selected by selecting any one of the word lines WL1 to WLn.

As another embodiment, even bit lines and odd bit lines may be provided instead of the first to m-th bit lines BL1 to BLm. In addition, even-numbered cell strings among the cell strings CS11 to CS1m or CS21 to CS2m arranged in the row direction may be connected to even bit lines, and odd-numbered cell strings among the cell strings CS11 to CS1m or CS21 to CS2m arranged in the row direction may be connected to odd bit lines, respectively.

As an embodiment, at least one of the first to n-th memory cells MC1 to MCn may be used as a dummy memory cell. For example, at least one dummy memory cell is provided to reduce an electric field between the source select transistor SST and the memory cells MC1 to MCp. Alternatively, at least one dummy memory cell is provided to reduce an electric field between the drain select transistor DST and the memory cells MCp+1 to MCn. As more dummy memory cells are provided, reliability of an operation for the memory block BLKa is improved, however, the size of the memory block BLKa increases. As less dummy memory cells are provided, the size of the memory block BLKa may be reduced, however, the reliability of the operation for the memory block BLKa may be reduced.

In order to efficiently control at least one dummy memory cell, each of the dummy memory cells may have a required threshold voltage. Before or after an erase operation for the memory block BLKa, program operations for all or a part of the dummy memory cells may be performed. When the erase operation is performed after the program operation is performed, the dummy memory cells may have the required threshold voltage by controlling a voltage applied to dummy word lines connected to the respective dummy memory cells.

Figure 5:
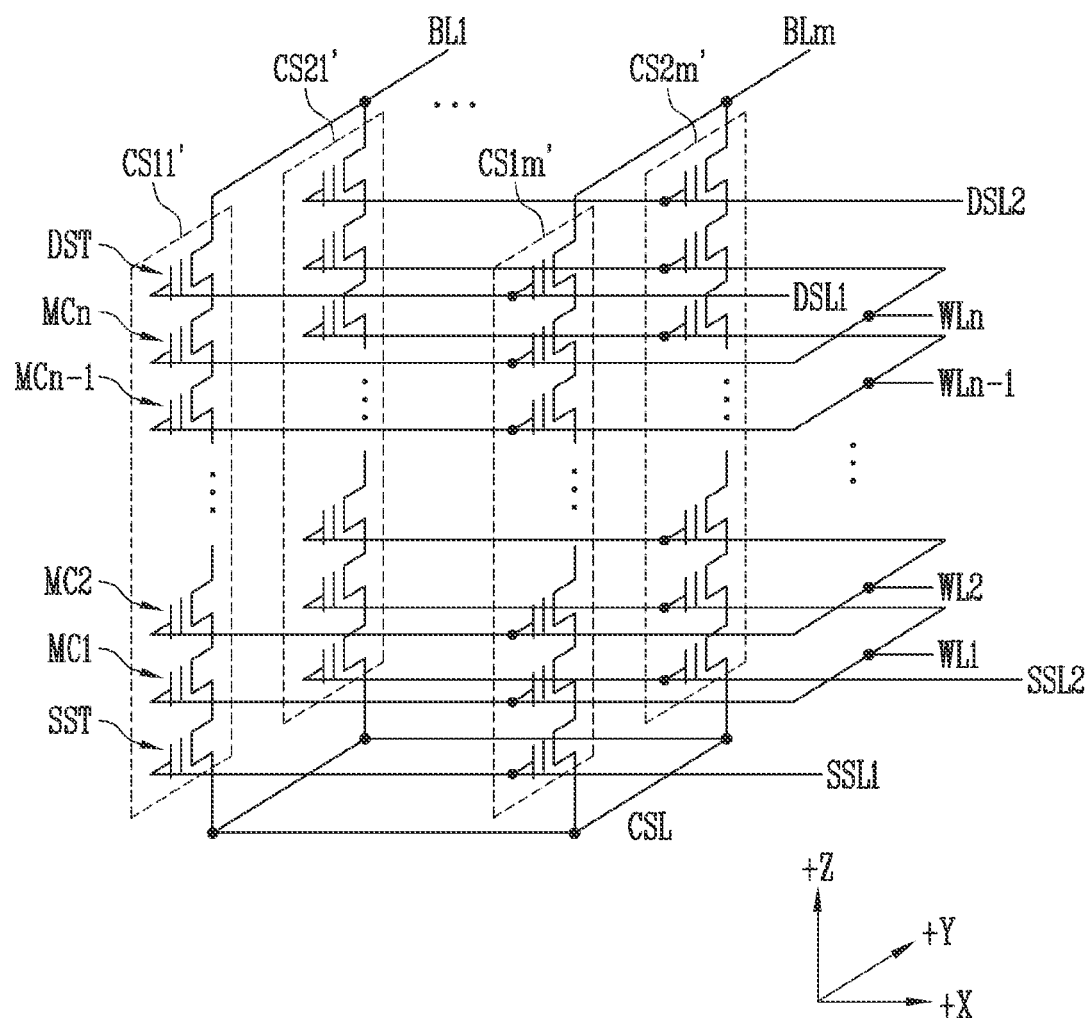
FIG. 5 is a circuit diagram illustrating another embodiment of any one memory block BLKb among the memory blocks BLK1 to BLKz of FIG. 3.

FIG. 5 is a circuit diagram illustrating another embodiment of any one memory block BLKb among the memory blocks BLK1 to BLKz of FIG. 3.

Referring to FIG. 5, the memory block BLKb includes a plurality of cell strings CS11' to CS1m' and CS21' to CS2m'. Each of the plurality of cell strings CS11' to CS1m' and CS21' to CS2m' extends along a +Z direction. Each of the plurality of cell strings CS11' to CS1m' and CS21' to CS2m' includes at least one source select transistor SST, first to n-th memory cells MC1 to MCn, and at least one drain select transistor DST stacked on a substrate (not shown) under the memory block BLK1'.

The source select transistor SST of each cell string is connected between a common source line CSL and memory cells MC1 to MCn. The source select transistors of the cell strings arranged in the same row are connected to the same source select line. The source select transistors of the cell strings CS11' to CS1m' arranged in a first row are connected to a first source select line SSL1. The source select transistors of the cell strings CS21' to CS2m' arranged in a second row are connected to a second source select line SSL2. As another embodiment, the source select transistors of the cell strings CS11' to CS1m' and CS21' to CS2m' may be commonly connected to one source select line.

The first to n-th memory cells MC1 to MCn of each cell string are connected in series between the source select transistor SST and the drain select transistor DST. Gates of the first to n-th memory cells MC1 to MCn are connected to first to the n-th word lines WL1 to MCn, respectively.

The drain select transistor DST of each cell string is connected between a corresponding bit line and the memory cells MC1 to MCn. The drain select transistors of the cell strings arranged in the row direction are connected to a drain select line extending in the row direction. The drain select transistors of the cell strings CS11' to CS1m of a first row are connected to a first drain select line DSL1. The drain select transistors of the cell strings CS21' to CS2m' of a second row are connected to a second drain select line DSL2.

As a result, the memory block BLKb of FIG. 5 has an equivalent circuit similar to that of the memory block BLKa of FIG. 4 except that the pipe transistor PT is excluded from each cell string.

As another embodiment, even bit lines and odd bit lines may be provided instead of the first to m-th bit lines BL1 to BLm. In addition, even-numbered cell strings among the cell strings CS11' to CS1m' or CS21' to CS2m' arranged in the row direction may be connected to even bit lines, and odd-numbered cell strings among the cell strings CS11' to CS1m' or CS21' to CS2m' arranged m the row direction may be connected to odd bit lines, respectively.

As an embodiment, at least one of the first to n-th memory cells MC1 to MCn may be used as a dummy memory cell. For example, at least one dummy memory cell is provided to reduce an electric field between the source select transistor SST and the memory cells MC1 to MCn. Alternatively, at least one dummy memory cell is provided to reduce an electric field between the drain select transistor DST and the memory cells MC1 to MCn. As more dummy memory cells are provided, reliability of an operation for the memory block BLKb is improved, however, the size of the memory block BLKb increases. As less memory cells are provided, the size of the memory block BLKb may be reduced, however, the reliability of the operation for the memory block BLKb may be reduced.

In order to efficiently control at least one dummy memory cell, each of the dummy memory cells may have a required threshold voltage. Before or after an erase operation for the memory block BLKb, program operations for all or a part of the dummy memory cells may be performed. When the erase operation is performed after the program operation is performed, the dummy memory cells may have the required threshold voltage by controlling a voltage applied to the dummy word lines connected to the respective dummy memory cells.

Figure 6:
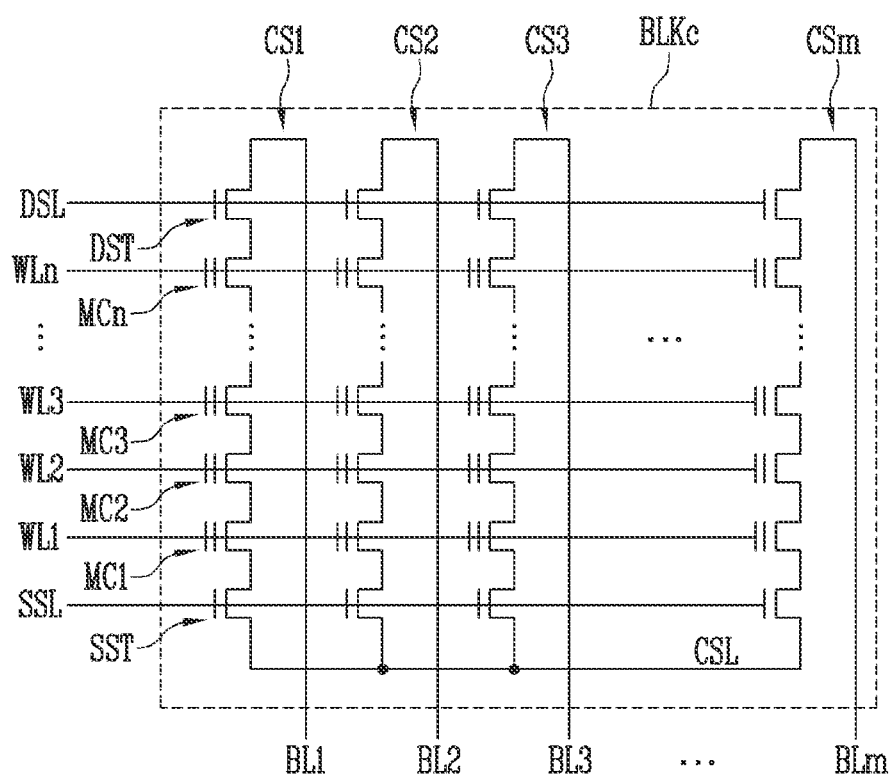
FIG. 6 is a circuit diagram illustrating an embodiment of any one memory block BLKc among the plurality of memory blocks BLK1 to BLKz included in the memory cell array 110 of FIG. 2.

FIG. 6 is a circuit diagram illustrating an embodiment of any one memory block BLKc among the plurality of memory blocks BLK1 to BLKz included in the memory cell array 110 of FIG. 2.

Referring to FIG. 6, the memory block BLKc includes a plurality of cell strings CS1 to CSm. The plurality of cell strings CS1 to CSm may be connected to a plurality of bit lines BL1 to BLm, respectively. Each of the cell strings CS1 to CSm includes at least one source select transistor SST, first to n-th memory cells MC1 to MCn, and at least one drain select transistor DST.

Each of the select transistors SST and DST and the memory cells MC1 to MCn may have a similar structure. As an embodiment, each of the select transistors SST and DST and the memory cells MC1 to MCn may include a channel layer, a tunneling insulating film, a charge storage film, and a blocking insulating film. As an embodiment, a pillar for providing the channel layer may be provided in each cell string. As an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCn.

The first to n-th memory cells MC1 to MCn of each cell string are connected between the source select transistor SST and the drain select transistor DST.

The drain select transistor DST of each cell string is connected between a corresponding bit line and the memory cells MC1 to MCn.

Memory cells connected to the same word line configure one page. The cell strings CS1 to CSm may be selected by selecting the drain select line DSL. One page among the selected cell strings may be selected by selecting any one of the word lines WL1 to WLn.

As another embodiment, even bit lines and odd bit lines may be provided instead of the first to m-th bit lines BL1 to BLm. Even-numbered cell strings among the cell strings CS1 to CSm may be connected to even bit lines, and odd-numbered cell strings may be connected to odd bit lines, respectively.

Figure 7:
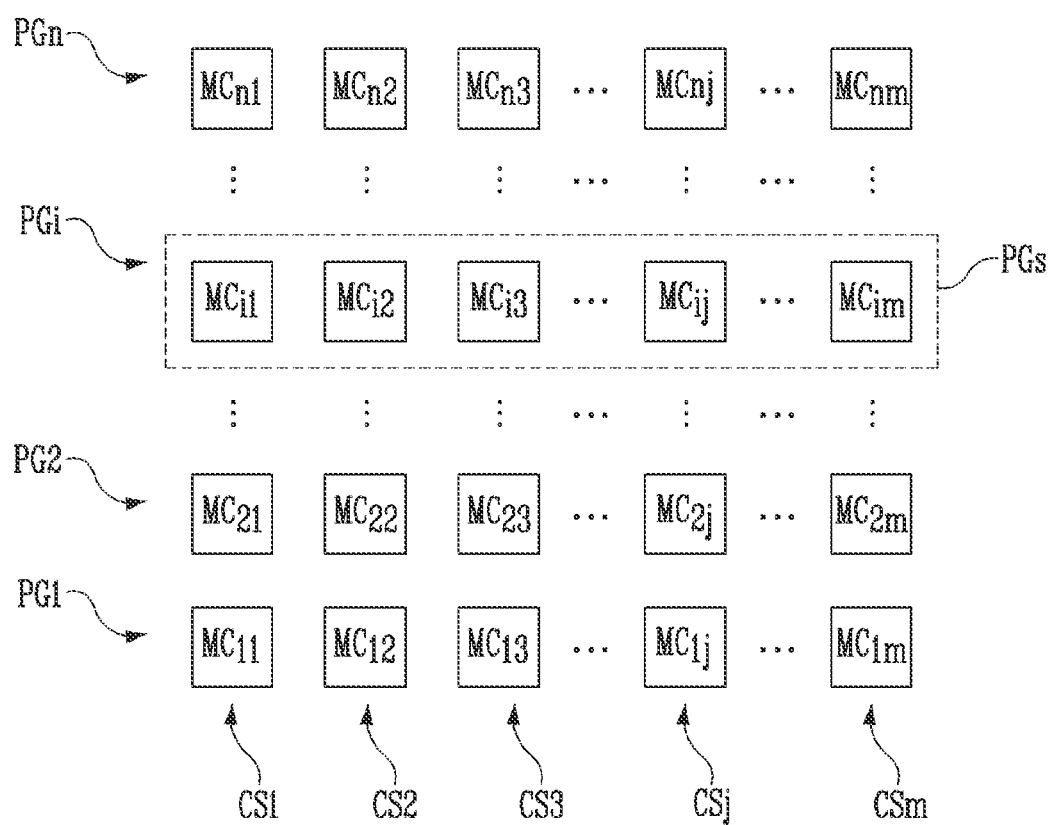
FIG. 7 is a diagram illustrating a page and a cell string formed by memory cells included in the memory cell array.

FIG. 7 is a diagram illustrating the page and the cell string formed by the memory cells included in the memory cell array.

Referring to FIG. 7, the memory block includes first to m-th cell strings CS1 to CSm. The first cell string CS1 includes n memory cells $MC_{11}$ to $MC_{n1}$. The second cell string CS2 also includes n memory cells $MC_{12}$ to $MC_{n2}$. In such a method, the m-th cell string CSm may include n memory cells $MC_{1m}$ to $MC_{nm}$.

Meanwhile, a first page PG1 includes m memory cells $MC_{11}$ to $MC_{1m}$. A second page PG2 also includes m memory cells $MC_{21}$ to $MC_{2m}$. In such a method, an n-th page PGn includes m memory cells $MC_{n1}$ to $MC_{nm}$.

The program operation of the semiconductor memory device 100 may be performed in a page unit. Therefore, any one of first to n-th pages may be selected as a read target. In an example of FIG. 7, an i-th page PGi may be a selected page PGs which is the program target. The i-th page PGi includes first to m-th memory cells $MC_{i1}$ to $MC_{im}$.

FIG. 8 is a flowchart illustrating a method of operating a semiconductor memory device according to an embodiment of the present disclosure. Selected memory cells are programmed by the method of operating the semiconductor memory device according to an embodiment of the present disclosure. Referring to FIG. 8, the method of operating the semiconductor memory device according to an embodiment of the present disclosure includes performing a program loop on memory cells to be programmed to a target threshold voltage state among the selected memory cells (S110), and determining whether a program on the selected memory cells is completed (S130). Step S110 includes adjusting a voltage of a bit line connected to a program permission cell and a program prohibition cell among the selected memory cells, respectively, and increasing a threshold voltage of the program permission cell by applying a program voltage to a word line connected to the program permission cell. In addition, step S110 further includes determining whether the threshold voltage of each memory cell is greater than the verify voltage by applying the verify voltage to the word line connected to the selected memory cells, after applying the program voltage to the word line connected to the selected memory cells. Examples of embodiments of step S110 are described below with reference to FIGS. 9 and 22.

Meanwhile, the method of operating the semiconductor memory device according to an embodiment of the present disclosure further includes determining that the program operation on the selected memory cells is successful (S140) when the program on the selected memory cells is completed (S130: Yes).

In addition, the method of operating the semiconductor memory device according to an embodiment of the present disclosure further includes determining whether the number of program loops performed so far is less than a maximum number of loops (S150) when the program on the selected memory cells is not completed (S130: No). During the program operation on the selected memory cells, the program loop of step S110 may be performed a plurality of times. However, in order to prevent the program loop for the selected memory cells from being repeated indefinitely, the maximum number of loops may be set. Whenever the program loop is performed, the number of performed program loops increases by one. When the program on the selected memory cells is not completed (S130: No), when the number of performed program loops is less than the maximum number of loops (S150: Yes), the method returns to step S110 and the program loop is performed once again.

Meanwhile, the method of operating the semiconductor memory device according to an embodiment of the present disclosure further includes determining that the program operation on the selected memory cells is failed (S170) when the number of program loops performed so far is not less than the maximum number of loops (S150: No). That is, in a case where the program on the selected memory cells is not completed (S130: No), when the number of performed program loops is greater than or equal to the maximum number of loops (S150: No), the program loop is not performed any more and it is determined that the program operation on the selected memory cells is failed (S170).

As described above, according to the method of operating the semiconductor memory device according to an embodiment of the present disclosure, the program loop is repeatedly performed until the program on the selected memory cells is completed. However, when the program is not completed even though the number of program loops performed so far reaches the maximum number of loops, it is determined that the program operation on the selected memory cells is failed.

FIG. 9 is a flowchart illustrating an embodiment of step S110 of FIG. 8. FIG. 10 is a graph illustrating a threshold voltage distribution after the program operation of the SLC. FIG. 11 is a flowchart illustrating an embodiment of step S210 of FIG. 9. Hereinafter, a step of setting a state of a bit line connected to the selected memory cells is described with reference to FIGS. 9 to 11 together.

Referring to FIG. 9, performing the program loop on the memory cells to be programmed to the target threshold voltage state among the selected memory cells (S110) includes setting the state of the bit line connected to the selected memory cells (S210), applying the program voltage to the word line connected to the selected memory cells (S230), and performing a verify operation on the selected memory cells (S250).

Among the selected memory cells, a memory cell of which a threshold voltage is increased in a current program loop is the program permission cell, and a memory cell of which a threshold voltage is maintained in a current program loop is the program prohibition cell. Both of the program permission cell and the program prohibition cell are applied to the same word line. When the program voltage is applied to the word line, a voltage of the bit line is adjusted to increase the threshold voltage of the program permission cell and maintain the threshold voltage of the program prohibition cell. In step S210, the voltage of the bit line connected to the program permission cell and the voltage of the bit line connected to the program prohibition cell are adjusted. As shown in FIG. 11, the step S210 includes applying a program permission voltage to the bit line connected to the program permission cell (S211) and applying a program prohibition voltage to the bit line connected to the program prohibition cell (S213). In an embodiment, the program prohibition voltage may be greater than the program permission voltage. For example, the program permission voltage may be a ground voltage. Meanwhile, in FIG. 11, step S213 is performed after step S211 is performed, the present disclosure is not limited thereto. That is, according to an embodiment, step S211 may be performed after step S213 is performed, or step S211 and step S213 may be performed simultaneously. The words "simultaneous" and "simultaneously" as used herein with respect to a step may mean that the step take place on overlapping intervals of time. For example, if a first step takes place over a first interval of time and a second step takes place simultaneously over a second interval of time, then the first and second intervals at least partially overlap each other such that there exists a time at which the first and second steps are both taking place.

Referring to FIG. 10, the threshold voltage distribution after the program operation of the SLC may be divided into an erase state E and a program state PVa. During the read operation, it is determined whether the memory cells are in the erase state E or the program state PVa by a read voltage Ra. Meanwhile, the threshold voltage of the memory cells to be programmed to the program state PVa is greater than a verify voltage Vvfa.

At an initial stage of the program operation, all of the selected memory cells may have the threshold voltage of the erase state E. Among the selected memory cells, memory cells required to be maintained in the erase state E become the program prohibition cells from the initial stage of the program operation. Meanwhile, among the selected memory cells, all of the memory cells to be programmed to the program state PVa become the program permission cells at the initial stage of the program operation.

In a state in which the program permission voltage is applied to the bit line connected to the program permission cell (S211) and the program prohibition voltage is applied to the bit line connected to the program prohibition cell (S213), when the program voltage is applied to the word line connected to the selected memory cells (S230), the threshold voltage of the program permission cells increases, and the threshold voltage of the program prohibition cells are maintained. Thereafter, it is determined whether the threshold voltage of the memory cells to be programmed to the program state PVa is greater than the verify voltage Vvfa, respectively, by performing a verify operation on the selected memory cells (S250).

As described above, at the initial stage of the program operation, all of the threshold voltages of the memory cells to be programmed to the program state PVa may be smaller than the verify voltage Vvfa. Therefore, all of the memory cells to be programmed to the program state PVa become the program permission cells at the initial stage of the program operation. As the program loop is repeatedly performed, the threshold voltage of the program permission cell increases. Accordingly, the threshold voltage of some program permission cells becomes greater than the verify voltage Vvfa. In performing the verify operation on the selected memory cells (S250), the state of the program permission cells having the threshold voltage greater than the verify voltage Vvfa is changed to the program prohibition cell. Therefore, the threshold voltage of the corresponding memory cells is no longer increased in a subsequent program loop.

Meanwhile, according to an embodiment of the present disclosure, the program operation may be performed using an incremental step pulse programming (ISPP) method. The ISPP method is a method of programming memory cells while gradually increasing a program voltage. Whenever the program loop is performed repeatedly, the program voltage applied to the word line connected to the memory cells selected in step S230 may gradually increase.

FIG. 12 is a flowchart illustrating an embodiment of step S250 of FIG. 9.

Referring to FIG. 12, performing the verify operation on the selected memory cells (S250) includes applying the verify voltage Vvfa to the word line connected to the selected memory cells (S251), determining the memory cells having the threshold voltage higher than the verify voltage Vvfa among the memory cells to be programmed to the program state PVa as the program prohibition cell (S253), and determining the memory cells having the threshold voltage lower than the verify voltage Vvfa among the memory cells to be programmed to the program state PVa as the program permission cell (S255).

That is, after the program voltage is applied to the word line connected to the selected memory cells (S230), it is determined whether the threshold voltage of the program permission cells becomes higher than the verify voltage Vvfa. To this end, it is determined whether the threshold voltage of the program permission cells among the selected memory cells is greater than the verify voltage Vvfa, by applying the verify voltage Vvfa to the selected word line (S251).

In step S253, among the memory cells to be programmed to the program state PVa, the memory cells having the threshold voltage higher than the verify voltage Vvfa are determined as the program prohibition cell. As shown in FIG. 10, memory cells having the threshold voltage higher than the verify voltage Vvfa are memory cells sufficiently programmed to belong to the program state PVa. Therefore, the memory cell having the threshold voltage higher than the verify voltage Vvfa is determined as the program prohibition cell so as not to increase the threshold voltage in a subsequent program loop.

In step S255, among the memory cells to be programmed to the program state PVa, the memory cells having the threshold voltage lower than the verify voltage Vvfa are determined as the program permission cell. As shown in FIG. 10, the memory cells having the threshold voltage lower than the verify voltage Vvfa are memory cells that do not yet belong to the program state PVa and memory cells that require an additional program. Therefore, the memory cell having the threshold voltage lower than the verify voltage Vvfa is determined as the program permission cell to increase the threshold voltage in the subsequent program loop.

Figure 13:
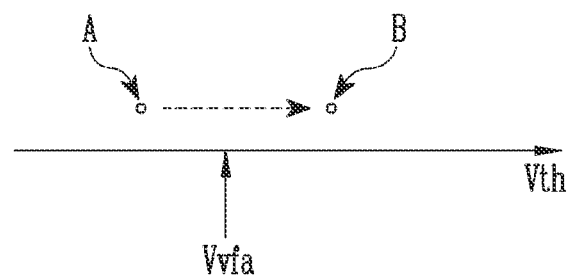
FIG. 13 is a diagram illustrating a threshold voltage of a program permission cell and a program prohibition cell.

FIG. 13 is a diagram illustrating the threshold voltage of the program permission cell and the program prohibition cell.

Referring to FIG. 13, a threshold voltage of a memory cell of a position A is lower than the verify voltage Vvfa. Therefore, the memory cell of the position A is the program permission cell. The threshold voltage of the program permission cell may increase, and thus the program permission cell may move to a position B in a next program loop. The threshold voltage of the memory cell of the position B is higher than the verify voltage Vvfa. Therefore, the memory cell moved to the position B is determined as the program prohibition cell, and the threshold voltage does not increase in the next program loop.

According to the embodiment described with reference to FIGS. 10 to 13, even in a case of a memory cell having a threshold voltage that is very slightly lower than the verify voltage Vvfa, the threshold voltage moves at a width similar to that of other program permission cells. This causes the threshold voltage of the memory cells belonging to the program state PVa to be widely distributed after the program operation. According to another embodiment of the present disclosure, a threshold voltage movement width of a program permission cell having a threshold voltage near a main verify voltage may be decreased by using a pre-verify voltage and the main verify voltage rather than one verify voltage. Through this, a distribution width of the threshold voltage of the memory cells belonging to the program state PVa may be reduced after the program operation.

Figure 14:
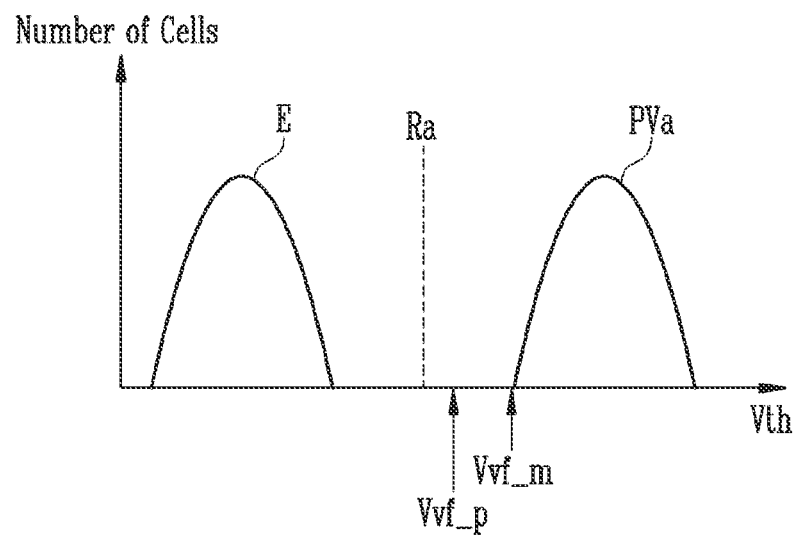
FIG. 14 is a graph illustrating a verify operation using a pre-verify voltage Vvf_p and a main verify voltage Vvf_m according to an embodiment of the present disclosure.

FIG. 14 is a graph illustrating a verify operation using a pre-verify voltage Vvf_p and a main verify voltage Vvf_m according to an embodiment of the present disclosure. According to an embodiment of the present disclosure, the pre-verify voltage Vvf_p and the main verify voltage Vvf_m may be used to determine a threshold voltage state of the memory cells to be programmed to the program state PVa. The main verify voltage Vvf_m of FIG. 14 may be substantially the same as the verify voltage Vvfa of FIG. 10. According to an embodiment of the present disclosure, the threshold voltage distribution of the memory cells may be reduced after the program operation, by additionally using the pre-verify voltage Vvf_p in addition to the main verify voltage Vvf_m.

FIG. 15 is a flowchart illustrating another embodiment of step S250 of FIG. 9.

Referring to FIG. 15, performing the verify operation on the selected memory cells (S250) includes applying the pre-verify voltage Vvf_p to the word line connected to the selected memory cells (S311), applying the main verify voltage Vvf_m to the word line connected to the selected memory cells (S313), determining memory cells having a threshold voltage higher than the main verify voltage Vvf_m among the memory cells to be programmed to the program state PVa as the program prohibition cell (S315), determining memory cells having a threshold voltage lower than the pre-verify voltage Vvf_p among the memory cells to be programmed to the program state PVa as a first program permission cell (S317), and determining memory cells having a threshold voltage lower than the main verify voltage Vvf_m and higher than the pre-verify voltage Vvf_p among the memory cells to be programmed to the program state PVa as a second program permission cell (S319).

That is, after the program voltage is applied to the word line connected to the selected memory cells (S230), it is determined whether the threshold voltage of the program permission cells is lower than the pre-verify voltage Vvf_p, the threshold voltage of the program permission cells is between the pre-verify voltage Vvf_p and the main verify voltage Vvf_m, or the threshold voltage of the program permission cells is higher than the main verify voltage Vvf_m. To this end, it is determined whether the threshold voltage of the program permission cells among the selected memory cells is greater than the pre-verify voltage Vvf_p, by applying the pre-verify voltage Vvf_p to the selected word line (S311). In addition, it is determined whether the threshold voltage of the program permission cells among the selected memory cells is greater than the main verify voltage Vvf_m, by applying the main verify voltage Vvf_m to the selected word line (S313).

In step S315, among the memory cells to be programmed to the program state PVa, the memory cells having the threshold voltage higher than the main verify voltage Vvf_m are determined as the program prohibition cell. As shown in FIG. 14, the memory cells having the threshold voltage higher than the main verify voltage Vvf_m are the memory cells sufficiently programmed to belong to the program state PVa. Therefore, the memory cell having the threshold voltage higher than the main verify voltage Vvf_m is determined as the program prohibition cell so as not to increase the threshold voltage in a subsequent program loop.

In step S317, among the memory cells to be programmed to the program state PVa, the memory cells having the threshold voltage lower than the pre-verify voltage Vvf_p is determined as the first program permission cell. As shown in FIG. 14, the memory cell having the threshold voltage lower than the pre-verify voltage Vvf_p is the memory cell that does not yet belong to the program state PVa and is the memory cell that requires an additional program. Therefore, the memory cell having the threshold voltage lower than the pre-verify voltage Vvf_p is determined as the first program permission cell to increase the threshold voltage in the subsequent program loop.

Meanwhile, in step S319, among the memory cells to be programmed to the program state PVa, the memory cells having the threshold voltage lower than the main verify voltage Vvf_m and higher than the pre-verify voltage Vvf_p are determined as the second program permission cells. As shown in FIG. 14, the memory cells having the threshold voltage lower than the main verify voltage Vvf_m and higher than the pre-verify voltage Vvf_p are also memory cells that do not yet belong to the program state PVa and memory cells that require an additional program. Therefore, the memory cell having the threshold voltage lower than the main verify voltage Vvf_m and higher than the pre-verify voltage Vvf_p is determined as the second program permission cell to increase the threshold voltage in the subsequent program loop.

Referring to FIG. 14 together, the first program permission cell is the memory cell having the threshold voltage lower than the pre verify voltage Vvf_p, and the second program permission cell is the memory cell having the threshold voltage between the pre verify voltage Vvf_p and the main verify voltage Vvf_m. That is, the second program permission cell is a memory cell having a threshold voltage closer to the main verify voltage Vvf_m than the first program permission cell. Therefore, according to the semiconductor memory device and the method of operating the same according to an embodiment of the present disclosure, a threshold voltage movement width of the second program permission cell is controlled to be less than a threshold voltage movement width of the first program permission cell in a subsequent program loop. To this end, a voltage applied to a bit line connected to the first program permission cell and a voltage applied to a bit line connected to the second program permission cell are applied differently. Hereinafter, the description is given with reference to FIG. 16.

FIG. 16 is a flowchart illustrating another embodiment of step S210 of FIG. 9. FIG. 17 is a diagram illustrating the threshold voltage of the first program permission cell, the second program permission cell, and the program prohibition cell. Hereinafter, setting the state of the bit line connected to the selected memory cells is described with reference to FIGS. 16 and 17 together.

Referring to FIG. 16, step S210 may include applying a first program permission voltage to the bit line connected to the first program permission cell (S331), applying a second program permission voltage to the bit line connected to the second program permission cell (S333), and applying the program prohibition voltage to the bit line connected to the program prohibition cell (S335). In an embodiment, the program prohibition voltage may be greater than the second program permission voltage, and the second program permission voltage may be greater than the first program permission voltage. For example, the first program permission voltage may be a ground voltage.

Since the first program permission voltage and the second program permission voltage are different from each other, when the program voltage is applied to the selected word line (S230), the threshold voltage movement width of the first program permission cell and the second program permission cell may be different. More specifically, since the second program permission voltage is greater than the first program permission voltage, the threshold voltage movement width of the first program permission cell is greater than the threshold voltage movement width of the second program permission cell.

Referring to FIG. 17, a threshold voltage of a memory cell of a position C is lower than the pre-verify voltage Vvf_p. Therefore, the memory cell of the position C is the first program permission cell. In addition, a threshold voltage of a memory cell of a position E is higher than the pre-verify voltage Vvf_p and lower than the main verify voltage Vvf_m. Therefore, the memory cell of the position E is the second program permission cell.

As described above, the first program permission voltage applied to the bit line connected to the first program permission cell is less than the second program permission voltage applied to the bit line connected to the second program permission cell. Therefore, the threshold voltage movement width of the first program permission cell is greater than the threshold voltage movement width of the second program permission cell. As shown in FIG. 17, the first program permission cell of the position C moves to a position D and thus becomes the program prohibition cell, and the second program permission cell of the position E moves to a position F and thus becomes the program prohibition cell. Since the threshold voltage movement width of the second program permission cell of the position E is less than the threshold voltage movement width of the first program permission cell of the position C, a threshold voltage distribution difference of the program prohibition cells of the position D and the position F becomes small. As a result, the threshold voltage distribution width of the memory cells on which the program is completed becomes narrow.

FIG. 18 is a flowchart illustrating still another embodiment of step S250 of FIG. 9.

Referring to FIG. 18, performing the verify operation on the selected memory cells (S250) includes applying the first pre-verify voltage Vvf_p1 to the word line connected to the selected memory cells (S411), applying a second pre-verify voltage Vvf_p2 to the word line connected to the selected memory cells (S412), applying the main verify voltage Vvf_m to the word line connected to the selected memory cells (S413), determining the memory cells having the threshold voltage higher than the main verify voltage Vvf_m among the memory cells to be programmed to the program state PVa as the program prohibition cell (S414), determining the memory cells having the threshold voltage lower than the first pre-verify voltage Vvf_p1 among the memory cells to be programmed to the program state PVa as the first program permission cell (S415), determining memory cells having a threshold voltage higher than the first pre-verify voltage Vvf_p1 and lower than the second pre-verify voltage Vvf_p2 among the memory cells to be programmed to the program state PVa as the second program permission cell (S416), and determining memory cells having a threshold voltage higher than the second pre-verify voltage Vvf_p2 and lower than the main verify voltage Vvf_m among the memory cells to be programmed to the program state PVa as a third program permission cell (S417).

That is, after the program voltage is applied to the word line connected to the selected memory cells (S230), it is determined whether the threshold voltage of the program permission cells exists in a section lower than the first pre-verify voltage Vvf_p1, exists in a section between the first pre-verify voltage Vvf_p1 and the second pre-verify voltage Vvf_p2, exists in a section between the second pre-verify voltage Vvf_p2 and the main verify voltage Vvf_m, or exists in a section higher than the main verify voltage Vvf_m. To this end, it is determined whether the threshold voltage of the program permission cells among the selected memory cells is greater than the first pre-verify voltage Vvf_p1 by applying the first pre-verify voltage Vvf_p1 to the selected word line (S411), it is determined whether the threshold voltage of the program permission cells among the selected memory cells is greater than the second pre-verify voltage Vvf_p2 by applying the second pre-verify voltage Vvf_p2 to the selected word line (S412), and it is determined whether the threshold voltage of the program permission cells among the selected memory cells is greater than the main verify voltage Vvf_m by applying the main verify voltage Vvf_m to the selected word line (S413).

In step S414, among the memory cells to be programmed to the program state PVa, the memory cells having the threshold voltage higher than the main verify voltage Vvf_m are determined as the program prohibition cell. The memory cells having the threshold voltage higher than the main verify voltage Vvf_m are the memory cells sufficiently programmed to belong to the program state PVa. Therefore, the memory cell having the threshold voltage higher than the main verify voltage Vvf_m is determined as the program prohibition cell so as not to increase the threshold voltage in a subsequent program loop.

In step S415, among the memory cells to be programmed to the program state PVa, the memory cells having the threshold voltage lower than the first pre-verify voltage Vvf_p1 are determined as the first program permission cell. The memory cells having the threshold voltage lower than the first pre-verify voltage Vvf_p1 are memory cells that do not yet belong to the program state PVa and memory cells that require an additional program. Therefore, the memory cell having the threshold voltage lower than the first pre-verify voltage Vvf_p1 is determined as the first program permission cell to increase the threshold voltage in a subsequent program loop.

In step S416, the memory cells having the threshold voltage higher than the first pre-verify voltage Vvf_p1 and lower than the second pre-verify voltage Vvf_p2 are determined as the second program permission cells. The memory cells having the threshold voltage higher than the first pre-verify voltage Vvf_p1 and lower than the second pre-verify voltage Vvf_p2 are also memory cells that do not yet belong to the program state PVa and memory cells that require an additional program. Therefore, the memory cell having the threshold voltage higher than the first pre-verify voltage Vvf_p1 and lower than the second pre-verify voltage Vvf_p2 is determined as the second program permission cell to increase the threshold voltage in a subsequent program loop.

Meanwhile, in step S417, among the memory cells to be programmed to the program state PVa, the memory cells having the threshold voltage higher than the second pre-verify voltage Vvf_p2 and lower than the main verify voltage Vvf_m are determined as the third program permission cell. The memory cells having the threshold voltage higher than the second pre-verify voltage Vvf_p2 and lower than the main verify voltage Vvf_m are also memory cells that do not yet belong to the program state PVa and memory cells that require an additional program. Therefore, the memory cell having the threshold voltage higher than the second pre-verify voltage Vvf_p2 and lower than the main verify voltage Vvf_m is determined as the third program permission cell to increase the threshold voltage in a subsequent program loop.

According to still another embodiment of the present disclosure, the memory cells of which the program is not yet completed are divided into the first to third program permission cells, by using the first and second pre-verify voltages Vvf_p1 and Vvf_p2 and the main verify voltage Vvf_m. Thereafter, threshold voltage movement widths of the first to third program permission cells are differently controlled in a subsequent program loop. More specifically, according to an embodiment of the present disclosure, the threshold voltage movement width of the second program permission cell is controlled to be less than the threshold voltage movement width of the first program permission cell, and the threshold voltage movement width of the third program permission cell is controlled to be less than the threshold voltage movement width of the second program permission cell. Hereinafter, the description is given with reference to FIG. 19.

Figure 19:
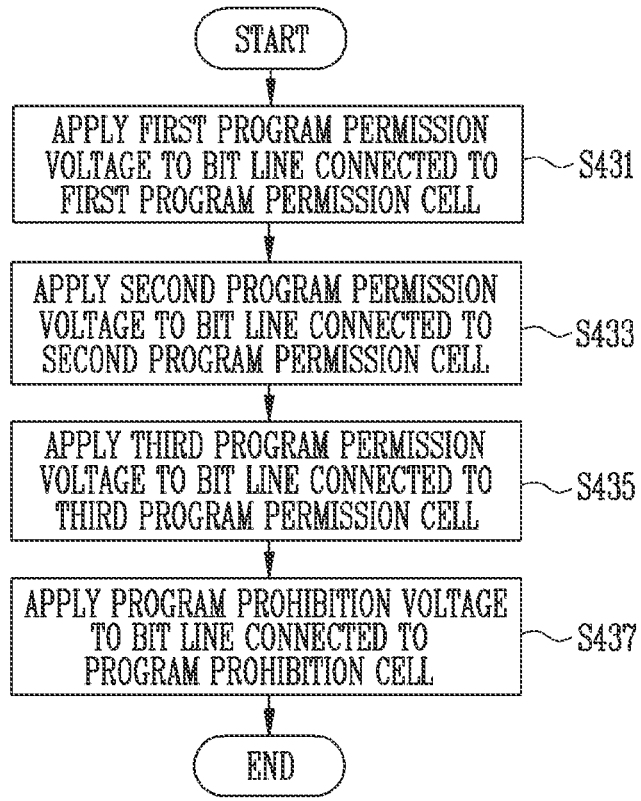
FIG. 19 is a flowchart illustrating still another embodiment of step S210 of FIG. 9.
Figure 20:
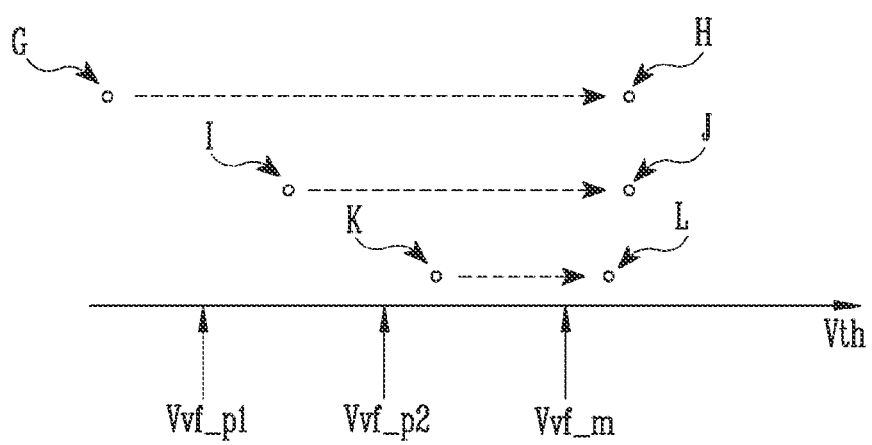
FIG. 20 is a diagram illustrating the threshold voltage of the first program permission cell, the second program permission cell, a third program permission cell, and the program prohibition cell.

FIG. 19 is a flowchart illustrating still another embodiment of step S210 of FIG. 9, FIG. 20 is a diagram illustrating the threshold voltage of the first program permission cell, the second program permission cell, the third program permission cell, and the program prohibition cell. Hereinafter, setting the state of the bit line connected to the selected memory cells is described with reference to FIGS. 19 and 20 together.

Referring to FIG. 19, step S210 may include applying the first program permission voltage to the bit line connected to the first program permission cell (S431), applying the second program permission voltage to the bit line connected to the second program permission cell (S433), applying a third program permission voltage to a bit line connected to the third program permission cell (S435), and applying the program prohibition voltage to the bit line connected to the program inhibiting cell (S437). In an embodiment, the program prohibition voltage may be greater than the third program permission voltage, the third program permission voltage may be greater than the second program permission voltage, and the second program permission voltage may be greater than the first program permission voltage. For example, the first program permission voltage may be a ground voltage.

Since the first to third program permission voltages are different from each other, threshold voltage movement widths of the first to third program permission cells may be different when the program voltage is applied to the selected word line (S230). More specifically, since the second program permission voltage is greater than the first program permission voltage, the threshold voltage movement width of the first program permission cell is greater than the threshold voltage movement width of the second program permission cell. In addition, since the third program permission voltage is greater than the second program permission voltage, the threshold voltage movement width of the second program permission cell is greater than the threshold voltage movement width of the third program permission cell.

Referring to FIG. 20, a threshold voltage of a memory cell of a position G is lower than the first pre-verify voltage Vvf_p1. Therefore, the memory cell of the position G is the first program permission cell. In addition, a threshold voltage of a memory cell at a position I is higher than the first pre-verify voltage Vvf_p1 and lower than the second pre-verify voltage Vvf_p2. Therefore, the memory cell at the position I is the second program permission cell. Meanwhile, a threshold voltage of a memory cell at a position K is higher than the second pre-verify voltage Vvf_p2 and lower than the main verify voltage Vvf_m. Therefore, the memory cell at the position K is the third program permission cell.

As described above, the first program permission voltage applied to the bit line connected to the first program permission cell is less than the second program permission voltage applied to the bit line connected to the second program permission cell. Therefore, the threshold voltage movement width of the first program permission cell is greater than the threshold voltage movement width of the second program permission cell. In addition, the second program permission voltage applied to the bit line connected to the second program permission cell is less than the third program permission voltage applied to the bit line connected to the third program permission cell. Therefore, the threshold voltage movement width of the second program permission cell is greater than the threshold voltage movement width of the third program permission cell.

As shown in FIG. 20, the first program permission cell of the position G moves to a position H and thus becomes the program prohibition cell, the second program permission cell of the position I moves to a position J and thus becomes the program prohibition cell, and the third program permission cell of the position K moves to a position L and thus becomes the program prohibition cell. Since the threshold voltage movement width of the second program permission cell of the position I is less than the threshold voltage movement width of the first program permission cell of the position G and the threshold voltage movement width of the third program permission cell of the position K is less than the threshold voltage movement width of the second program permission cell of the position I, a threshold voltage distribution difference of the program prohibition cells of the position H, the position J, and the position L is reduced. As a result, the threshold voltage distribution width of the memory cells of which the program is completed becomes narrow.

As described with reference to FIGS. 18 to 20, according to an embodiment of the present disclosure, the first program permission cell, the second program permission cell, the third program permission cell, and the program prohibition cells are determined by using the first pre-verify voltage, the second pre-verify voltage, and the main verify voltage during the verify operation. In addition, according to an embodiment of the present disclosure, thereafter, voltages of each bit line connected to the first to third program permission cells are set differently in the bit line state setting step S210 of the program loop. Accordingly, the width of the threshold voltage distribution of the memory cells of which the program is completed may be further narrowed, by differently adjusting the threshold voltage movement width of the first to third program permission cells, FIG. 21 is a graph illustrating a threshold voltage distribution after the program operation of the MLC.

Figure 21:
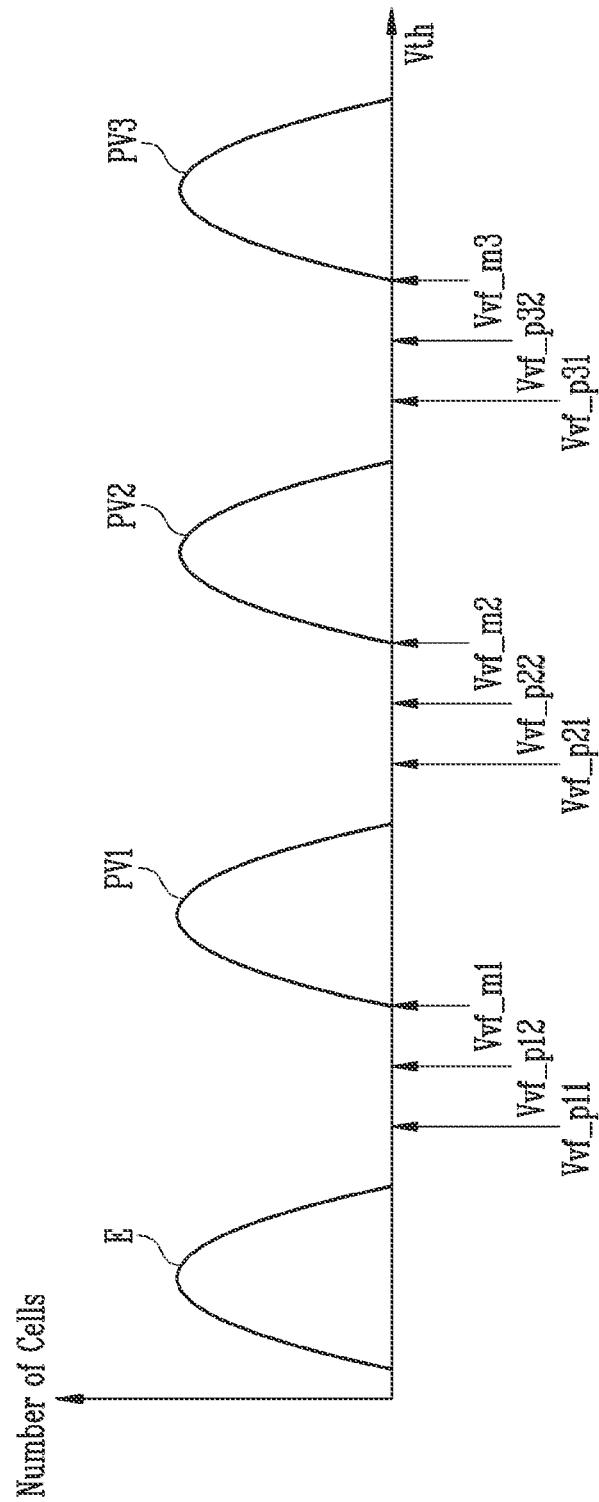
FIG. 21 is a graph illustrating a threshold voltage distribution after a program operation of a multi-level cell (MLC).

Referring to FIG. 21, the MLC in which two bits are stored per one memory cell belongs to any one of an erase state E, a first program state PV1, a second program state PV2, and a third program state PV3 after the program operation. According to an embodiment of the present disclosure, two pre-verify voltages and one main verify voltage are used during a verify operation corresponding to each of the first to third program states PV1 to PV3.

For example, according to an embodiment of the present disclosure, during the verify operation corresponding to the first program state PV1, a first pre-verify voltage Vvf_p11, a second pre-verify voltage Vvf_p12, and a main verify voltage Vvf_m1 corresponding to the first program state PV1 are used. In addition, during the verify operation corresponding to the second program state PV2, a first pre-verify voltage Vvf_p21, a second pre-verify voltage Vvf_p22, and a main verify voltage Vvf_m2 corresponding to the second program state PV2 are used. Finally, during the verify operation corresponding to the third program state PV3, a first pre-verify voltage Vvf_p31, a second pre-verify voltage Vvf_p32, and a main verify voltage Vvf_m3 corresponding to the third program state PV3 are used.

During the verify operation corresponding to the first program state PV1, the verify operation is performed on memory cells to be programmed to the first program state PV1. That is, during the verify operation corresponding to the first program state PV1, the memory cells to be programmed to the first program state PV1 are determined as any one of the first to third program permission cells and the program prohibition cell. Meanwhile, during the verify operation corresponding to the first program state PV1, the memory cells to be programmed to the second program state PV2 and the third program state PV3 may be collectively determined as the program permission cells. Hereinafter, the description is given with reference to FIGS. 22 and 23.

Figure 22:
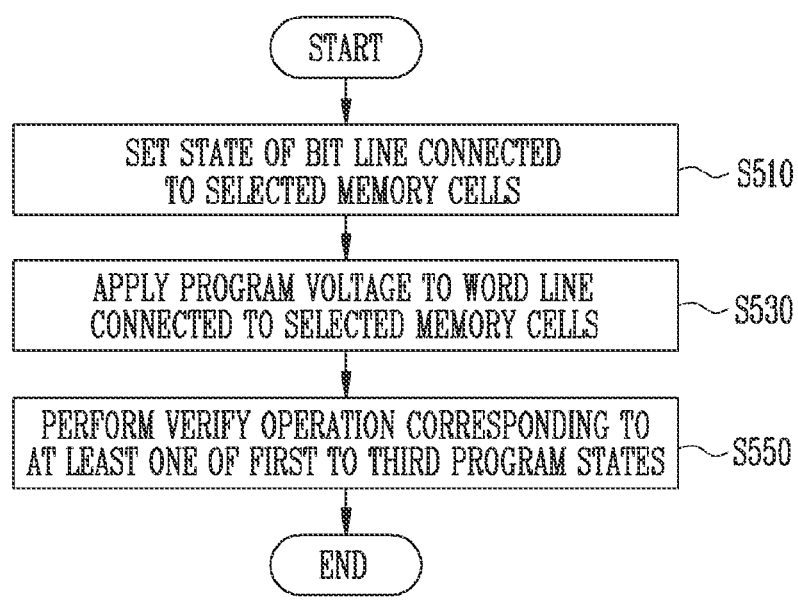
FIG. 22 is a flowchart illustrating another embodiment of step S110 of FIG. 8.

FIG. 22 is a flowchart illustrating another embodiment of step S110 of FIG. 8.

Referring to FIG. 22, performing the program loop on the memory cells to be programmed to the target threshold voltage state among the selected memory cells (S110) includes setting the state of the bit line connected to the selected memory cells (S510), applying the program voltage to the word line connected to the selected memory cells (S530), and performing the verify operation corresponding to at least one of the first to third program states PV1 to PV3 (S550). In the present specification, the verify operation corresponding to the first program state PV1 may refer to the verify operation on the memory cells to be programmed to the first program state PV1. In the verify operation corresponding to the first program state PV1, the first pre-verify voltage Vvf_p11, the second pre-verify voltage Vvf_p12, and the main verify voltage Vvf_m1 are used. In addition, in the present specification, the verify operation corresponding to the second program state PV2 may refer to the verify operation on the memory cells to be programmed to the second program state PV2. In the verify operation corresponding to the second program state PV2, the first pre-verify voltage Vvf_p21, the second pre-verify voltage Vvf_p22, and the main verify voltage Vvf_m2 are used. Meanwhile, in the present specification, the verify operation corresponding to the third program state PV3 may refer to the verify operation on the memory cells to be programmed to the third program state PV3. In the verify operation corresponding to the third program state PV3, the first pre-verify voltage Vvf_p31, the second pre-verify voltage Vvf_p32, and the main verify voltage Vvf_m3 are used.

Figure 23:
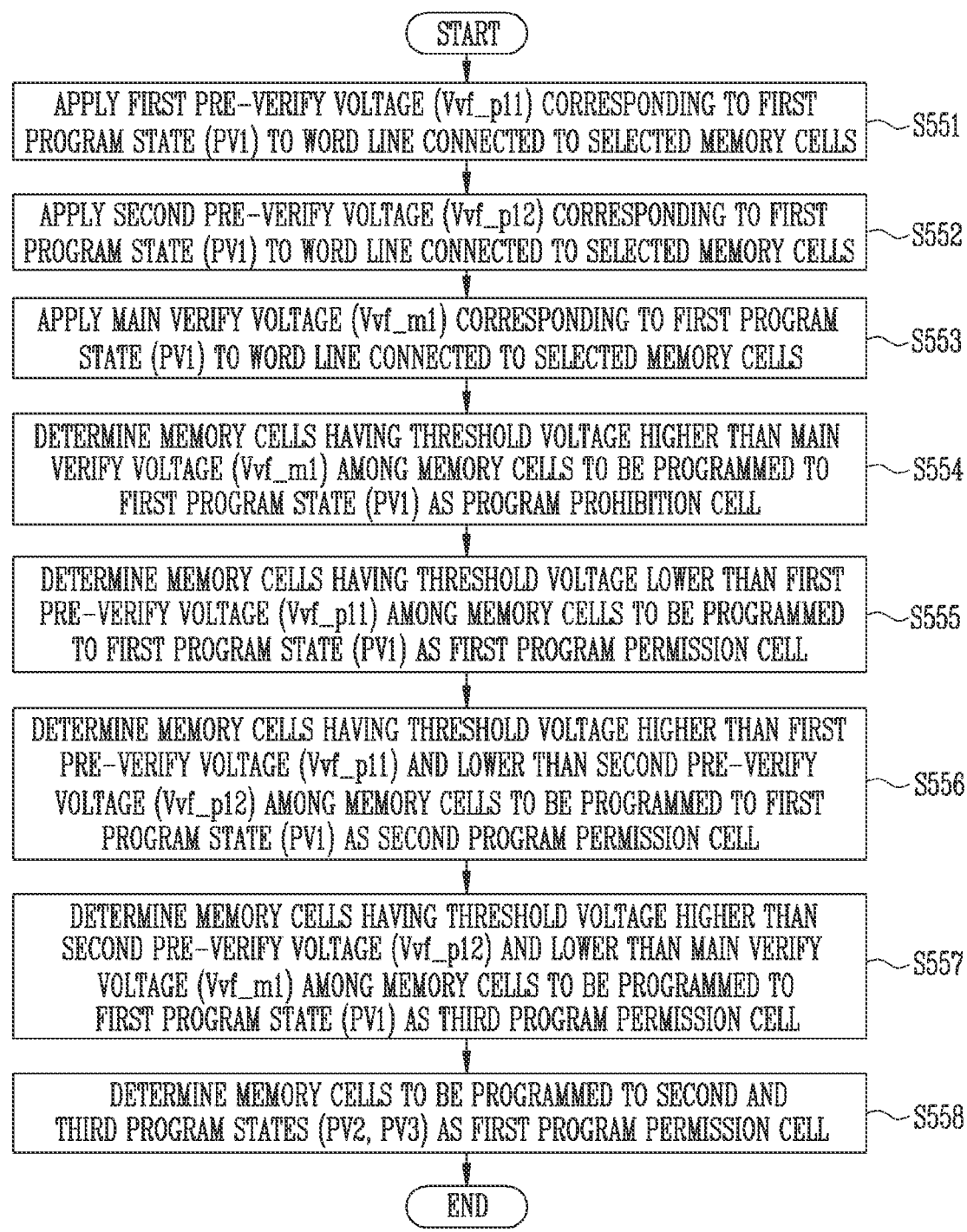
FIG. 23 is a flowchart illustrating an embodiment of step S550 of FIG. 22.

FIG. 23 is a flowchart illustrating an embodiment of step S550 of FIG. 22.

Referring to FIG. 23, a process of performing the verify operation on the first program state PV1 among the first to third program states is illustrated as an example. However, the present disclosure is not limited thereto, and the verify operation on the second program state PV2 or the third program state PV3 may be similarly performed.

The process of performing the verify operation corresponding to the first program state PV1 includes applying the first pre-verify voltage Vvf_p11 corresponding to the first program state PV1 to the word line connected to the selected memory cells (S551), applying the second pre-verify voltage Vvf_p12 corresponding to the first program state PV1 to the word line connected to the selected memory cells (S552), applying the first main verify voltage Vvf_m1 corresponding to the first program state PV1 to the word line connected to the selected memory cells (S553), determining memory cells having a threshold voltage higher than the main verify voltage Vvf_m1 among the memory cells to be programmed to the first program state PV1 as the program prohibition cell (S554), determining memory cells having a threshold voltage lower than the first pre-verify voltage Vvf_p11 among the memory cells to be programmed to the first program state PV1 as the first program permission cell (S555), determining memory cells having a threshold voltage higher than the first pre-verify voltage Vvf_p11 and lower than the second pre-verify voltage Vvf_p12 among the memory cells to be programmed to the first program state PV1 as the second program permission cell (S556), determining memory cells having a threshold voltage higher than the second pre-verify voltage Vvf_p12 and lower than the main verify voltage Vvf_m1 among the memory cells to be programmed to the first program state PV1 as the third program permission cell (S557), and determining memory cells to be programmed to the second and third program states PV2 and PV3 as the first program permission cell (S558).

That is, after the program voltage is applied to the word line connected to the selected memory cells (S230), it is determined whether the threshold voltage of the memory cells to be programmed to the first program state PV1 exists in a section lower than the first pre-verify voltage Vvf_p11, exists in a section between the first pre-verify voltage Vvf_p11 and the second pre-verify voltage Vvf_p12, exists in a section between the second pre-verify voltage Vvf_p12 and the main verify voltage Vvf_m1, or exists in a section higher than the main verify voltage Vvf_m1. To this end, it is determined whether the threshold voltage of the memory cells to be programmed to the first program state is greater than the first pre-verify voltage Vvf_p11 by applying the first pre-verify voltage Vvf_p11 to the selected word line (S551), it is determined whether the threshold voltage of the memory cells to be programmed to the first program state is greater than the second pre-verify voltage Vvf_p12 by applying the second pre-verify voltage Vvf_p12 to the selected word line (S552), and it is determined whether the threshold voltage of the memory cells to be programmed to the first program state is greater than the main verify voltage Vvf_m1 by applying the main verify voltage Vvf_m1 to the selected word line (S553).

In step S554, among the memory cells to be programmed to the first program state PV1, the memory cells having the threshold voltage higher than the main verify voltage Vvf_m1 are determined as the program prohibition cell. The memory cells having the threshold voltage higher than the main verify voltage Vvf_m1 are memory cells sufficiently programmed to belong to the first program state PV1. Therefore, among the memory cells to be programmed to the first program state PV1, the memory cell having the threshold voltage higher than the main verify voltage Vvf_m1 is determined as the program prohibition cell so as not to increase the threshold voltage in a subsequent program loop.

In step S555, among the memory cells to be programmed to the first program state PV1, the memory cells having the threshold voltage lower than the first pre-verify voltage Vvf_p11 are determined as the first program permission cell. The memory cells having the threshold voltage lower than the first pre-verify voltage Vvf_p11 are memory cells that do not yet belong to the first program state PV1 and memory cells that require an additional program. Therefore, among the memory cells to be programmed to the first program state PV1, the memory cell having the threshold voltage lower than the first pre-verify voltage Vvf_p11 is determined as the first program permission cell to increase the threshold voltage in a subsequent program loop.

In step S556, among the memory cells to be programmed to the first program state PV1, the memory cells having the threshold voltage higher than the first pre-verify voltage Vvf_p11 and lower than the second pre-verify voltage Vvf_p12 are determined as the second program permission cells. The memory cells having the threshold voltage higher than the first pre-verify voltage Vvf_p11 and lower than the second pre-verify voltage Vvf_p12 are also memory cells that do not yet belong to the first program state PV1 and memory cells that require an additional program. Therefore, the memory cell having the threshold voltage higher than the first pre-verify voltage Vvf_p11 and lower than the second pre-verify voltage Vvf_p12 is determined as the second program permission cell to increase the threshold voltage in a subsequent program loop.

Meanwhile, in step S557, among the memory cells to be programmed to the first program state PV1, the memory cells having the threshold voltage higher than the second pre-verify voltage Vvf_p12 and lower than the main verify voltage Vvf_m1 are determined as the third program permission cell. Among the memory cells to be programmed to the first program state PV1, the memory cells having the threshold voltage higher than the second pre-verify voltage Vvf_p12 and lower than the main verify voltage Vvf_m1 are also memory cells that do not yet belong to the program state PVa and memory cells that require an additional program. Therefore, the memory cell having the threshold voltage higher than the second pre-verify voltage Vvf_p12 and lower than the main verify voltage Vvf_m1 is determined as the third program permission cell to increase the threshold voltage in a subsequent program loop.

In step S558, the memory cells to be programmed to the second and third program states PV2 and PV3 are determined as the first program permission cell. Since steps shown in FIG. 23 are the verify operation corresponding to the first program state PV1, the threshold voltage of the memory cells to be programmed to the second and third program states PV2 and PV3 might not be required to be verified in this process. The threshold voltage of the memory cells to be programmed to the second program state PV2 may be verified in the verify operation corresponding to the second program state PV2. In addition, the threshold voltage of the memory cells to be programmed to the third program state PV3 may be verified in the verify operation corresponding to the third program state PV3. Therefore, in step S558, the memory cells to be programmed to the second and third program states PV2 and PV3 are determined as the first program permission cell to set a threshold voltage movement width of the memory cells to be programmed to the second and third program states PV2 and PV3 as large as possible in a subsequent program loop. Through this, the entire program operation speed of the semiconductor memory device may be improved.

Figure 24:
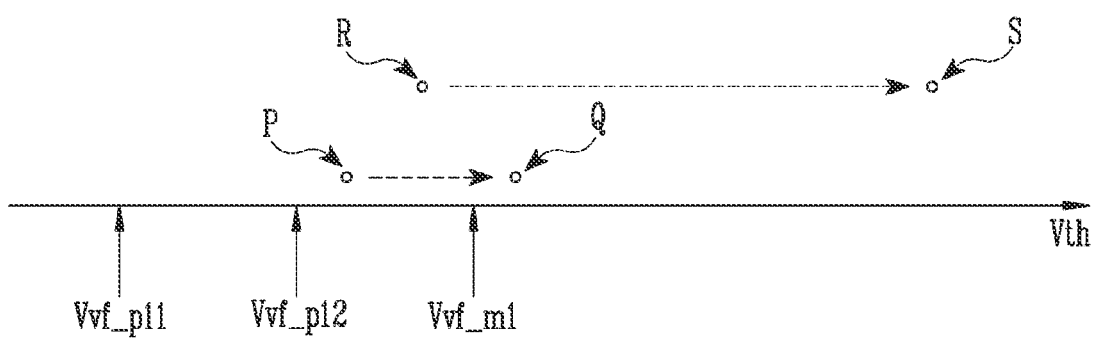
FIG. 24 is a diagram illustrating the threshold voltage of the third program permission cell and the first program permission cell.

FIG. 24 is a diagram illustrating a threshold voltage of the third program permission cell and the first program permission cell.

Referring to FIG. 24, a memory cell of a position R is a memory cell to be programmed to the second program state PV2 or the third program state PV3. Accordingly, a threshold voltage of the memory cell of the position R is between the second pre-verify voltage Vvf_p12 and the main verify voltage Vvf_m1 corresponding to the first program state PV1, but the memory cell of the position R is still determined as the first program permission cell.

Meanwhile, a memory cell of a position P is a memory cell to be programmed to the first program state PV1. Referring to FIG. 24, a threshold voltage of the memory cell of the position P is higher than the second pre-verify voltage Vvf_p12 corresponding to the first program state PV1 and lower than the main verify voltage Vvf_m1. Therefore, the memory cell of position P is the third program permission cell.

As shown in FIG. 24, both of the threshold voltages of the memory cells of the position R and the position P are higher than the second pre-verify voltage Vvf_p12 corresponding to the first program state PV1 and is lower than the main verify voltage Vvf_m1. However, since the memory cell of the position R is the memory cell to be programmed to the second program state PV2 or the third program state PV3, the memory cell of the position R is determined as the first program permission cell (S558), and the memory cell of the position P is determined as the third program permission cell (S557).

As described above with reference to FIGS. 18 to 20, the first program permission voltage applied to the bit line connected to the first program permission cell is less than the second program permission voltage applied to the bit line connected to the second program permission cell. Therefore, the threshold voltage movement width of the first program permission cell is greater than the threshold voltage movement width of the second program permission cell. In addition, the second program permission voltage applied to the bit line connected to the second program permission cell is less than the third program permission voltage applied to the bit line connected to the third program permission cell. Therefore, the threshold voltage movement width of the second program permission cell is greater than the threshold voltage movement width of the third program permission cell.

As shown in FIG. 24, the first program permission cell of the position R moves to a position S. Since the first program permission cell of the position R is the memory cell to be programmed to the second program state PV2 or the third program state PV3, even though the first program permission cell moves to the position 5, the corresponding memory cell maintains the first program permission cell. Meanwhile, the third program permission cell of the position P moves to a position Q and thus becomes the program prohibition cell.

As described with reference to FIGS. 18 to 20, according to an embodiment of the present disclosure, during the verify operation corresponding to the first program state PV1, the first program permission cell, the second program permission cell, the third program permission cell, and the program prohibition cell among the memory cells to be programmed to the first program state PV1 are determined, by using the first pre-verify voltage, the second pre-verify voltage, and the main verify voltage. Meanwhile, during the verify operation corresponding to the first program state PV1, the memory cells to be programmed to the second and third program states PV2 and PV3 are determined as the first program permission cell. Meanwhile, according to an embodiment of the present disclosure, thereafter, in the bit line state setting step S210 of the program loop, the voltages of each bit line connected to the first to third program permission cells are set differently. Accordingly, the width of the threshold voltage distribution of the memory cells of which the program is completed may be further narrowed by differently adjusting the threshold voltage movement width of the first to third program permission cells. In addition, since the memory cells to be programmed to the second and third program states PV2 and PV3 are determined as the first program permission cell, a program speed of the memory cells to be programmed to the second and third program states PV2 and PV3 may be improved. Therefore, the entire program speed of the semiconductor memory device may be improved.

Although the method of operating the semiconductor memory device for programming the MLC is described through FIGS. 21 to 24, the present disclosure is not limited thereto. That is, the method according to the present disclosure is also applicable to a method of programming the TLC or the QLC. In addition, the present disclosure is also applicable to a semiconductor memory device that stores data of five bits or more per memory cell.

Figure 25:
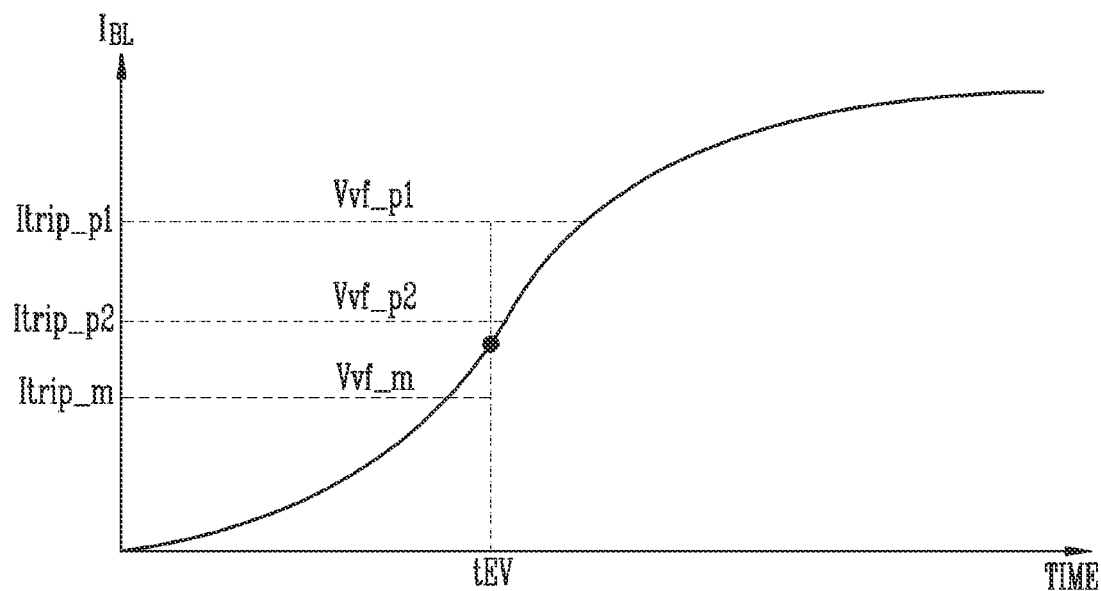
FIG. 25 is a graph illustrating a method of performing a verify operation using different reference currents, according to still another embodiment of the present disclosure.

FIG. 25 is a graph illustrating a method of performing a verify operation using different reference currents, according to still another embodiment of the present disclosure. Hereinafter, the description is given with reference to FIGS. 20 and 25 together. More specifically, the verify operation using different reference currents with respect to a memory cell having a threshold voltage corresponding to the position K of FIG. 20 is described.

FIG. 25 illustrates an effect of a case where the threshold voltage of the selected memory cell is verified using different reference currents.

Referring to FIG. 25, a bit line current $I_{BL}$ at a constant evaluation time tEV is determined on a curve. The measured bit line current $I_{BL}$ is compared with a reference current to determine whether the selected memory cell coupled to the bit line is an on-cell or an off-cell. When sensing is performed using a first reference current Itrip_p1, since the bit line current $I_{BL}$ at the evaluation time tEV has a value less than the first reference current Itrip_p1, the selected memory cell may be determined as the off-cell. When sensing is performed using a second reference current Itrip_p2, since the bit line current $I_{BL}$ at the evaluation time tEV has a value less than the second reference current Itrip_p2, the selected memory cell may be determined as the off-cell. When sensing is performed using a main reference current Itrip_m, since the bit line current $I_{BL}$ at the evaluation time tEV has a value greater than the main reference current Itrip_m, the selected memory cell may be determined as the on-cell.

As described above, when the reference current is applied differently, the same cell may be determined as the on-cell or the off-cell. That is, as the reference current applied differently, it may have the same effect as adjusting the verify voltage. Accordingly, in a case where sensing is performed using the first reference current Itrip_p1, the case has the same effect as sensing using the first pre-verify voltage Vvf_p1, and in a case where sensing is performed using the second reference current Itrip_p2, the case has the same effect as sensing using the second pre-verify voltage Vvf_p2. Meanwhile, in a case where sensing is performed using the main reference current Itrip_m, the case has the same effect as sensing using the main verify voltage Vvf_m.

Figure 26:
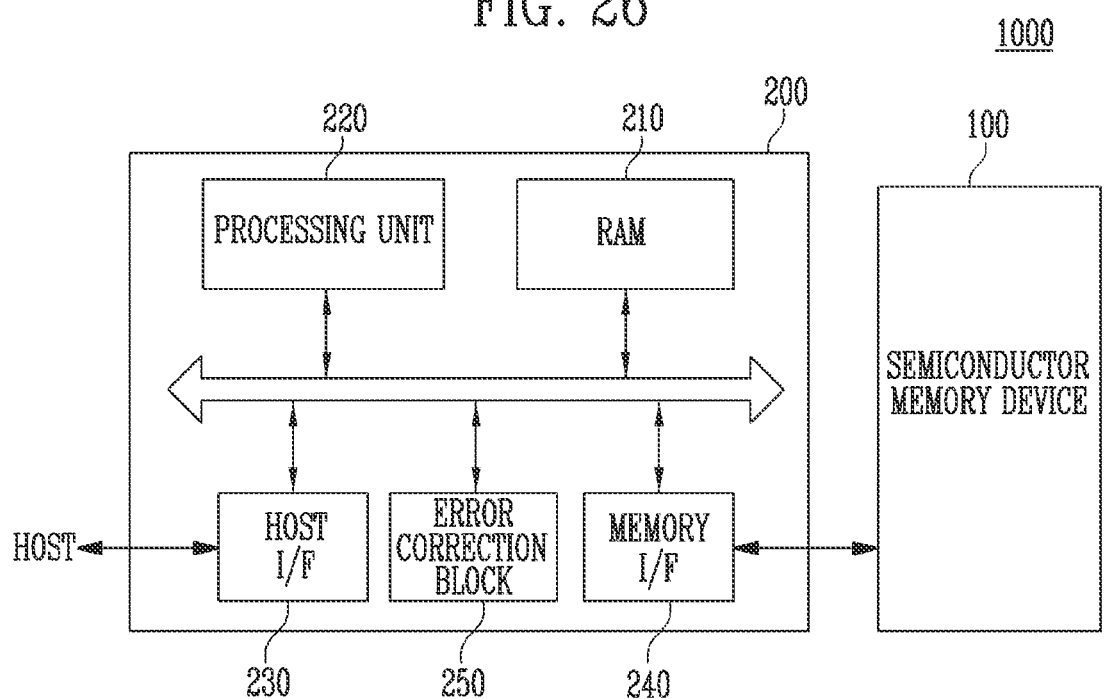
FIG. 26 is a block diagram illustrating an example of the controller shown in FIG. 1.

FIG. 26 is a block diagram illustrating an example of the controller shown in FIG. 1.

Referring to FIG. 26, the controller 200 is connected to the semiconductor memory device 100 and a host HOST. The semiconductor memory device 100 may be the semiconductor memory device described with reference to FIG. 2.

The controller 200 is configured to access the semiconductor memory device 100 in response to a request from the host Host. For example, the controller 200 is configured to control read, write, erase, and background operations of the semiconductor memory device 100. The controller 200 is configured to provide an interface between the semiconductor memory device 100 and the host Host. The controller 200 is configured to drive firmware for controlling the semiconductor memory device 100.

The controller 200 includes a random access memory (RAM) 210, a processing unit 220, a host interface 230, a memory interface 240, and an error correction block 250. The RAM 210 is used as at least one of an operation memory of the processing unit 220, a cache memory between the semiconductor memory device 100 and the host Host, and a buffer memory between the semiconductor memory device 100 and the host Host.

The processing unit 220 controls an overall operation of the controller 200.

The host interface 230 includes a protocol for performing data exchange between the host Host and the controller 200. As an example of an embodiment, the controller 200 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial ATA protocol, a parallel ATA protocol, a small computer system interface (SCSI) protocol, an enhanced small disk interface (ESDI) protocol, an integrated drive electronics (IDE) protocol, and a private protocol.

The memory interface 240 interfaces with the semiconductor memory device 100. For example, the memory interface 240 includes a NAND interface or a NOR interface. The memory interface 240 of FIG. 10 may be substantially the same component as the memory interface 207 of FIG. 7.

The error correction block 250 is configured to detect and correct an error of data received from the semiconductor memory device 100 using an error correcting code (ECC). The processing unit 220 may control the semiconductor memory device 100 to adjust a read voltage and perform re-read according to an error detection result of the error correction block 250.

The controller 200 and the semiconductor memory device 100 may be integrated into one semiconductor device. As an example of an embodiment, the controller 200 and the semiconductor memory device 100 may be integrated into one semiconductor device to form a memory card. For example, the controller 200 and the semiconductor memory device 100 may be integrated into one semiconductor device to form a memory card such as a PC card (personal computer memory card international association (PCMCIA)), a compact flash card (CF), a smart media card (SM or SMC), a memory stick, a multimedia card (MMC, RS-MMC, or MMCmicro), an SD card (SD, miniSD, microSD, or SDHC), and a universal flash storage (UFS).

The controller 200 and the semiconductor memory device 100 may be integrated into one semiconductor device to form a semiconductor drive (solid state drive (SSD)). The semiconductor drive (SSD) includes the memory system 1000 configured to store data in a semiconductor memory. When the memory system 1000 including the controller 200 and the semiconductor memory device 100 is used as the semiconductor drive (SSD), an operation speed of the host connected to the memory system 1000 is dramatically improved.

As another example, the memory system 1000 including the controller 200 and the semiconductor memory device 100 is provided as one of various components of an electronic device such as a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, and a digital video player, a device capable of transmitting and receiving information in a wireless environment, one of various electronic devices configuring a home network, one of various electronic devices configuring a computer network, one of various electronic devices configuring a telematics network, an RFID device, or one of various components configuring a computing system.

As an example of an embodiment, the semiconductor memory device 100 and the memory system including the same may be mounted as a package of various types. For example, the semiconductor memory device 100 or the memory system may be packaged and mounted in a method such as a package on package (PoP), ball grid arrays (BGAs), chip scale packages (CSPs), plastic leaded chip carriers (PLCO), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline integrated circuit package (SOIC), a shrink small outline package (SSOP), a thin small outline package (TSOP), a system in package (SIP), a multi-chip package (MCP), a wafer-level fabricated package (WFP), or a wafer-level processed stack package (WSP).

Figure 27:
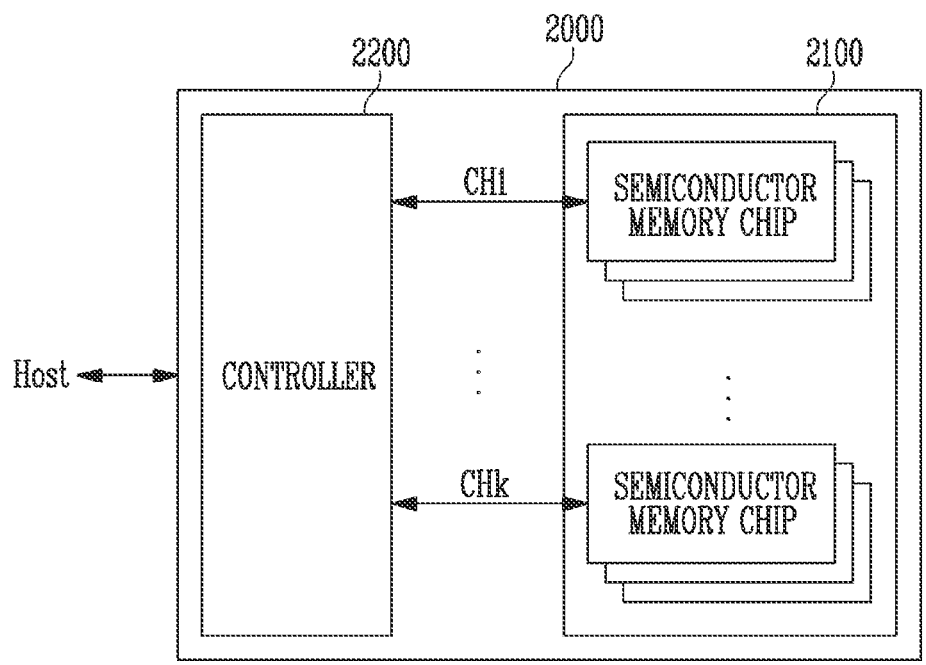
FIG. 27 is a block diagram illustrating an application example of a memory system of FIG. 26.

FIG. 27 is a block diagram illustrating an application example of the memory system of FIG. 26.

Referring to FIG. 27, the memory system 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 27, the plurality of groups communicate with the controller 2200 through first to k-th channels CH1 to CHk, respectively. Each semiconductor memory chip is configured and is operated similarly to that of the semiconductor memory device 100 described with reference to FIG. 2.

Each group is configured to communicate with the controller 2200 through one common channel. The controller 2200 is configured similarly to the controller 200 described with reference to FIG. 26 and is configured to control the plurality of memory chips of the semiconductor memory device 2100 through the plurality of channels CH1 to CHk.

Figure 28:
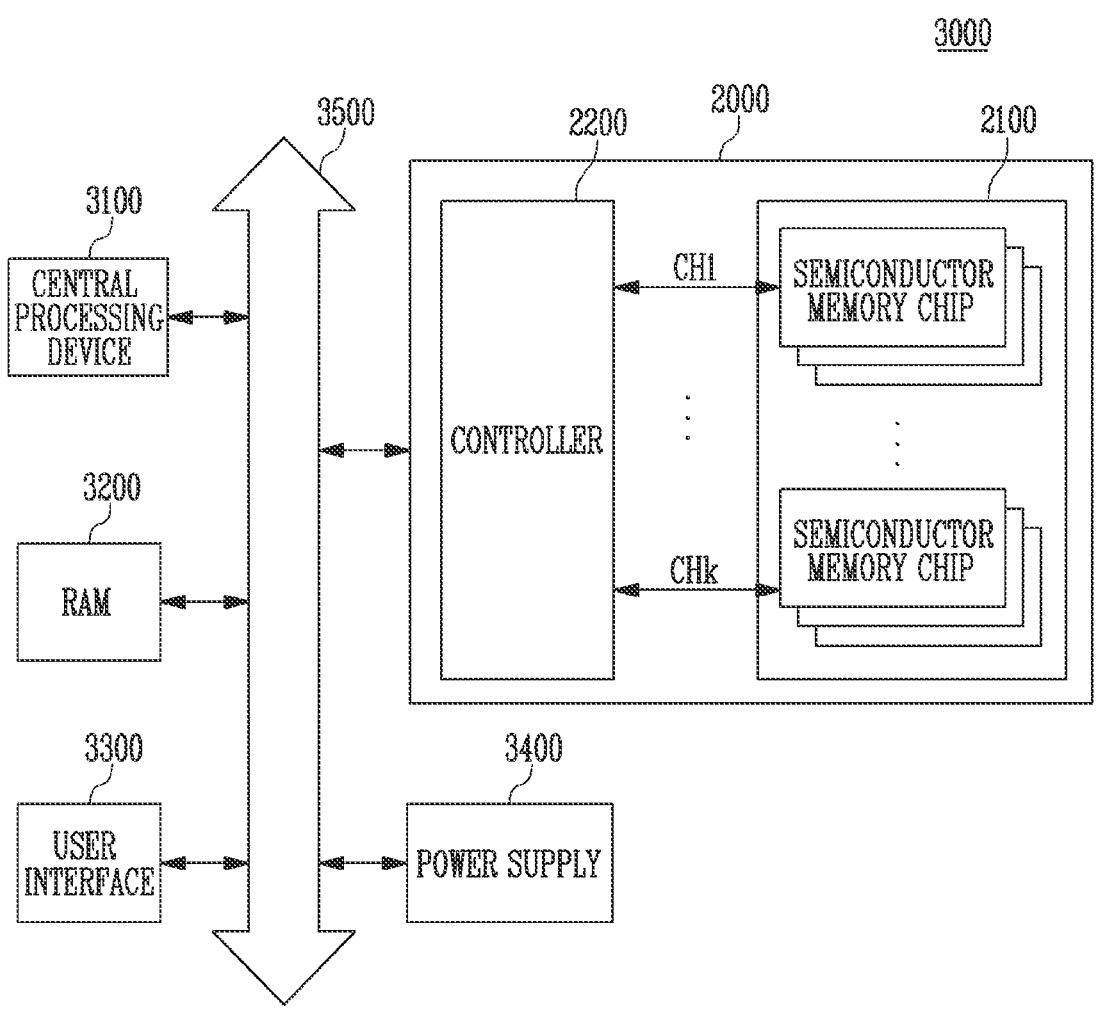
FIG. 28 is a block diagram illustrating a computing system including the memory system described with reference to FIG. 27.

FIG. 28 is a block diagram illustrating a computing system including the memory system described with reference to FIG. 27.

The computing system 3000 includes a central processing device 3100, a random access memory (RAM) 3200, a user interface 3300, a power supply 3400, a system bus 3500, and the memory system 2000.

The memory system 2000 is electrically connected to the central processing device 3100, the RAM 3200, the user interface 3300, and the power supply 3400 through the system bus 3500. Data provided through the user interface 3300 or processed by the central processing device 3100 is stored in the memory system 2000.

In FIG. 28, the semiconductor memory device 2100 is connected to the system bus 3500 through the controller 2200. However, the semiconductor memory device 2100 may be configured to be directly connected to the system bus 3500. At this time, a function of the controller 2200 is performed by the central processing device 3100 and the RAM 3200.

In FIG. 28, the memory system 2000 described with reference to FIG. 27 is provided. However, the memory system 2000 may be replaced with the memory system 1000 including the controller 200 and the semiconductor memory device 100 described with reference to FIG. 26.

The embodiments of the present disclosure are not intended to limit the scope of the present disclosure.

What is claimed is:

1. A method of operating a semiconductor memory device including a plurality of program loops for programming selected memory cells among a plurality of memory cells to a first program state higher than an erase state and a second program state higher than the first program state, wherein each of the plurality of program loops comprises:
   applying a program voltage to a word line connected to the selected memory cells;
   performing a verify operation on the selected memory cells to be programmed to the first program state among a plurality of program states using a first pre-verify voltage, a second pre-verify voltage greater than the first pre-verify voltage, and a main verify voltage greater than the second pre-verify voltage;
   applying, based on a result of the verify operation, a first program permission voltage, a second program permission voltage greater than the first program permission voltage, a third program permission voltage greater than the second program permission voltage, or a program prohibition voltage greater than the third program permission voltage to bit lines connected to first memory cells among the selected memory cells; and
   applying the first program permission voltage to bit lines connected to second memory cells to be programmed to the second program state among the selected memory cells when the first memory cells are programed.

2. The method of claim 1, wherein performing the verify operation on the selected memory cells comprises:
   applying the first pre-verify voltage to the word line connected to the selected memory cells;
   applying the second pre-verify voltage to the word line connected to the selected memory cells; and
   applying the main verify voltage to the word line connected to the selected memory cells.

3. The method of claim 2,
   wherein performing the verify operation on the selected memory cells further comprises determining memory cells having a threshold voltage higher than the main verify voltage as a program prohibition cell.

4. The method of claim 3,
   wherein performing the verify operation on the selected memory cells further comprises:
   determining memory cells having a threshold voltage lower than the first pre-verify voltage as a first program permission cell;
   determining memory cells having a threshold voltage higher than the first pre-verify voltage and lower than the second pre-verify voltage as a second program permission cell; and
   determining memory cells having a threshold voltage higher than the second pre-verify voltage and lower than the main verify voltage as a third program permission cell.

5. The method of claim 4,
   wherein applying the first program permission voltage, the second program permission voltage, the third program permission voltage, or the program prohibition voltage to the bit lines connected to the first memory cells comprises:
   applying the first program permission voltage to a bit line connected to the first program permission cell;
   applying the second program permission voltage to a bit line connected to the second program permission cell; and
   applying the third program permission voltage to a bit line connected to the third program permission cell.

6. The method of claim 5,
   wherein applying the first program permission voltage, the second program permission voltage, the third program permission voltage, or the program prohibition voltage to the bit lines connected to the first memory cells further comprises applying the program prohibition voltage to a bit line connected to the program prohibition cell.

7. A method of operating a semiconductor memory device including a plurality of program loops for programming selected memory cells among a plurality of memory cells to an i-th program state higher than an erase state, wherein each of the plurality of memory cells stores N bits, and each of the plurality of program loops comprises:
  applying a program voltage to a word line connected to the selected memory cells;
  performing a verify operation on first memory cells to be programmed to the i-th program state using a first pre-verify voltage, a second pre-verify voltage, and a main verify voltage corresponding to the i-th program state among first to (2N−1)-th program states;
  applying, based on a result of the verify operation, a first program permission voltage, a second program permission voltage, a third program permission voltage, or a program prohibition voltage to bit lines connected to the first memory cells among the selected memory cells; and
  applying the first program permission voltage to bit lines connected to second memory cells to be programmed to program states higher than the i-th program state among the selected memory cells,
  wherein, N is a natural number greater than 1, and i is a natural number greater than 0 and less than 2N.

8. The method of claim 7, wherein performing the verify operation corresponding to the i-th program state comprises:
  applying the first pre-verify voltage corresponding to a first program state to the word line connected to the selected memory cells;
  applying the second pre-verify voltage corresponding to the first program state to the word line connected to the selected memory cells; and
  applying the main verify voltage corresponding to the first program state to the word line connected to the selected memory cells.

9. The method of claim 8, wherein the second pre-verify voltage corresponding to the first program state is greater than the first pre-verify voltage corresponding to the first program state, and the main verify voltage corresponding to the first program state is greater than the second pre-verify voltage corresponding to the first program state.

10. The method of claim 9, wherein performing the verify operation corresponding to the i-th program state further comprises determining memory cells having a threshold voltage higher than the main verify voltage among the memory cells to be programmed to the first program state as a program prohibition cell.

11. The method of claim 10, wherein performing the verify operation corresponding to the i-th program state further comprises:
  determining memory cells having a threshold voltage lower than the first pre-verify voltage corresponding to the first program state among the memory cells to be programmed to the first program state as a first program permission cell;
  determining a memory cell having a threshold voltage higher than the first pre-verify voltage corresponding to the first program state and lower than the second pre-verify voltage corresponding to the first program state among the memory cells to be programmed to the first program state as a second program permission cell; and
  determining a memory cell having a threshold voltage higher than the second pre-verify voltage corresponding to the first program state and lower than the main verify voltage corresponding to the first program state among the memory cells to be programmed to the first program state as a third program permission cell.

12. The method of claim 11, wherein performing the verify operation corresponding to the i-th program state further comprises determining memory cells to be programmed to the second to (2N−1)-th program states as the first program permission cell.

13. The method of claim 12, wherein applying the first program permission voltage, the second program permission voltage, the third program permission voltage, or the program prohibition voltage to the bit lines connected to the first memory cells comprises:
  applying the first program permission voltage to a bit line connected to the first program permission cell;
  applying the second program permission voltage greater than the first program permission voltage to a bit line connected to the second program permission cell; and
  applying the third program permission voltage greater than the second program permission voltage to a bit line connected to the third program permission cell.

14. The method of claim 13, wherein applying the first program permission voltage, the second program permission voltage, the third program permission voltage, or the program prohibition voltage to the bit lines connected to the first memory cells further comprises applying the program prohibition voltage greater than the third program permission voltage to a bit line connected to the program prohibition cell.

15. A method of operating a semiconductor memory device including a plurality of program loops for programming selected memory cells among a plurality of memory cells to a first program state higher than an erase state, and program states higher than the first program state, wherein each of the plurality of program loops comprises:
  setting states of bit lines connected to the selected memory cells;
  applying program voltages to word lines connected to the selected memory cells;
  performing a verify operation corresponding to the first program state among a plurality of program states on the selected memory cells to distinguish program permission cells from program prohibition cells;
  controlling, based on the verify operation, threshold voltage movement widths of respective program permission cells to be programmed to the first program state from the selected memory cells by applying at least three different program permission voltages to respective bit lines connected to the program permission cells; and
  applying a ground voltage to bit lines connected to memory cells to be programmed to the program states among the selected memory cells.

16. The method of claim 15, further comprising maintaining threshold voltages of the program prohibition cells.

* * * * *